(12) United States Patent
Yamane et al.

(10) Patent No.: US 12,389,801 B2
(45) Date of Patent: *Aug. 12, 2025

(54) ACOUSTIC WAVE DEVICE

(71) Applicant: Murata Manufacturing Co., Ltd., Nagaokakyo (JP)

(72) Inventors: Takashi Yamane, Nagaokakyo (JP); Sho Nagatomo, Nagaokakyo (JP); Tetsuya Kimura, Nagaokakyo (JP); Katsuya Daimon, Nagaokakyo (JP); Takuya Koyanagi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 491 days.

This patent is subject to a terminal disclaimer.

(21) Appl. No.: 17/701,988

(22) Filed: Mar. 23, 2022

(65) Prior Publication Data
US 2022/0216846 A1    Jul. 7, 2022

Related U.S. Application Data

(63) Continuation of application No. PCT/JP2020/036400, filed on Sep. 25, 2020.

(30) Foreign Application Priority Data

Sep. 27, 2019 (JP) .................................. 2019-178098

(51) Int. Cl.
*H10N 30/87* (2023.01)
*H03H 9/02* (2006.01)
(Continued)

(52) U.S. Cl.
CPC ...... *H10N 30/874* (2023.02); *H03H 9/02031* (2013.01); *H03H 9/02228* (2013.01);
(Continued)

(58) Field of Classification Search
CPC .... H03H 9/02031; H03H 9/145; H03H 9/132; H03H 9/564; H03H 9/02015;
(Continued)

(56) References Cited

U.S. PATENT DOCUMENTS

| 2013/0057360 A1* | 3/2013 | Meltaus | ................. H03H 9/564 |
| | | | 29/25.35 |
| 2014/0152145 A1* | 6/2014 | Kando | ............... H03H 9/02574 |
| | | | 29/25.35 |

(Continued)

FOREIGN PATENT DOCUMENTS

| JP | 2012-257019 A | 12/2012 |
| JP | 2013-528996 A | 7/2013 |

(Continued)

OTHER PUBLICATIONS

Official Communication issued in International Patent Application No. PCT/JP2020/036400 mailed on Dec. 15, 2020.

*Primary Examiner* — Daniel L Murphy
*Assistant Examiner* — Amie M Ndure
(74) *Attorney, Agent, or Firm* — Keating & Bennett, LLP

(57) ABSTRACT

An acoustic wave device includes a piezoelectric layer and first and second electrodes facing each other in a direction crossing a thickness direction of the piezoelectric layer. The acoustic wave device utilizes a bulk wave of a thickness slip first-order mode. The acoustic wave device includes first and second resonators. Each of the first and second resonators includes the first and second electrodes, and a setting portion including a setup region where the first and second electrodes are provided in the piezoelectric layer. The thickness of each of the first and second resonators excludes the thickness of the first and second electrodes included in the resonator. The thickness of the first resonator is different from the thickness of the second resonator.

26 Claims, 21 Drawing Sheets

(51) Int. Cl.
*H03H 9/13*     (2006.01)
*H03H 9/145*    (2006.01)
*H03H 9/17*     (2006.01)
*H03H 9/25*     (2006.01)
*H03H 9/56*     (2006.01)
*H10N 30/076*   (2023.01)

(52) U.S. Cl.
CPC ............ *H03H 9/132* (2013.01); *H03H 9/145* (2013.01); *H03H 9/174* (2013.01); *H03H 9/175* (2013.01); *H03H 9/176* (2013.01); *H03H 9/25* (2013.01); *H03H 9/562* (2013.01); *H03H 9/564* (2013.01); *H03H 9/568* (2013.01); *H10N 30/076* (2023.02)

(58) Field of Classification Search
CPC ........ H03H 9/176; H03H 9/562; H03H 9/568; H03H 9/175; H03H 9/174; H03H 9/02228; H03H 9/02157; H03H 9/25; H10N 30/874; H10N 30/076
See application file for complete search history.

(56)         References Cited

U.S. PATENT DOCUMENTS

2017/0373663 A1* 12/2017 Kishimoto ......... H03H 9/02228
2017/0373667 A1* 12/2017 Murase ................... H03H 9/25

FOREIGN PATENT DOCUMENTS

JP      2018-007239 A    1/2018
WO      2012/073871 A1   6/2012

* cited by examiner

ACOUSTIC WAVE DEVICE

CROSS REFERENCE TO RELATED APPLICATIONS

This application claims the benefit of priority to Japanese Patent Application No. 2019-178098 filed on Sep. 27, 2019 and is a Continuation Application of PCT Application No. PCT/JP2020/036400 filed on Sep. 25, 2020. The entire contents of each application are hereby incorporated herein by reference.

BACKGROUND OF THE INVENTION

1. Field of the Invention

The present invention relates to acoustic wave devices generally, and more specifically to acoustic wave devices including piezoelectric layers.

2. Description of the Related Art

Acoustic wave devices using plate waves propagating through piezoelectric layers made of $LiNbO_3$ or $LiTaO_3$ have been known. For example, Japanese Unexamined Patent Application Publication No. 2012-257019 discloses an acoustic wave device using a Lamb wave as a plate wave. In the acoustic wave device described in Japanese Unexamined Patent Application Publication No. 2012-257019, an interdigital transducer (IDT) electrode (a first electrode and a second electrode) is provided on an upper surface of a piezoelectric substrate (piezoelectric layer) made of $LiNbO_3$ or $LiTaO_3$. Then, when a voltage is applied between a plurality of electrode fingers connected to one potential of the IDT electrode and a plurality of electrode fingers connected to the other potential thereof, a Lamb wave is excited. Reflectors are provided on both sides of the IDT electrode, and the IDT electrode and the reflectors define an acoustic wave resonator using a plate wave.

In the acoustic wave device described in Japanese Unexamined Patent Application Publication No. 2012-257019, it is conceivable to reduce the number of electrode fingers in order to miniaturize the device. However, when the number of electrode fingers is reduced, the Q value is lowered. Further, it is also difficult to adjust the resonant frequency of the acoustic wave device.

SUMMARY OF THE INVENTION

Preferred embodiments of the present invention provide acoustic wave devices that are each able to increase a Q value and adjust a resonant frequency even when miniaturized.

An acoustic wave device according to a preferred embodiment of the present invention includes a piezoelectric layer, and a first electrode and a second electrode facing each other in a direction crossing a thickness direction of the piezoelectric layer. The acoustic wave device utilizes a bulk wave of a thickness slip first-order mode. The acoustic wave device includes a first resonator and a second resonator. Each of the first resonator and the second resonator includes the first electrode, the second electrode, and a setting portion where the first electrode and the second electrode are provided in the piezoelectric layer. A thickness of the first resonator excludes a thickness of the first electrode and the second electrode included in the first resonator in the setting portion of the first resonator. A thickness of the second resonator excludes the thickness of the first electrode and the second electrode included in the second resonator in the setting portion of the second resonator. The thickness of the first resonator is different from the thickness of the second resonator.

An acoustic wave device according to a preferred embodiment of the present invention includes a piezoelectric layer, and a first electrode and a second electrode facing each other in a direction crossing a thickness direction of the piezoelectric layer. The first electrode and the second electrode are adjacent to each other. In any cross section along the thickness direction, in a case that a distance between a center line of the first electrode and a center line of the second electrode is denoted as p, and a thickness of the piezoelectric layer is denoted as d, d/p is not greater than about 0.5. The acoustic wave device includes a first resonator and a second resonator. Each of the first resonator and the second resonator includes the first electrode, the second electrode, and a setting portion where the first electrode and the second electrode are provided in the piezoelectric layer. A thickness of the first resonator excludes a thickness of the first electrode and the second electrode included in the first resonator in the setting portion of the first resonator. A thickness of the second resonator excludes the thickness of the first electrode and the second electrode included in the second resonator in the setting portion of the second resonator. The thickness of the first resonator is different from the thickness of the second resonator.

According to preferred embodiments of the present invention, it is possible to increase a Q value and adjust a resonant frequency even when miniaturization is carried out.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
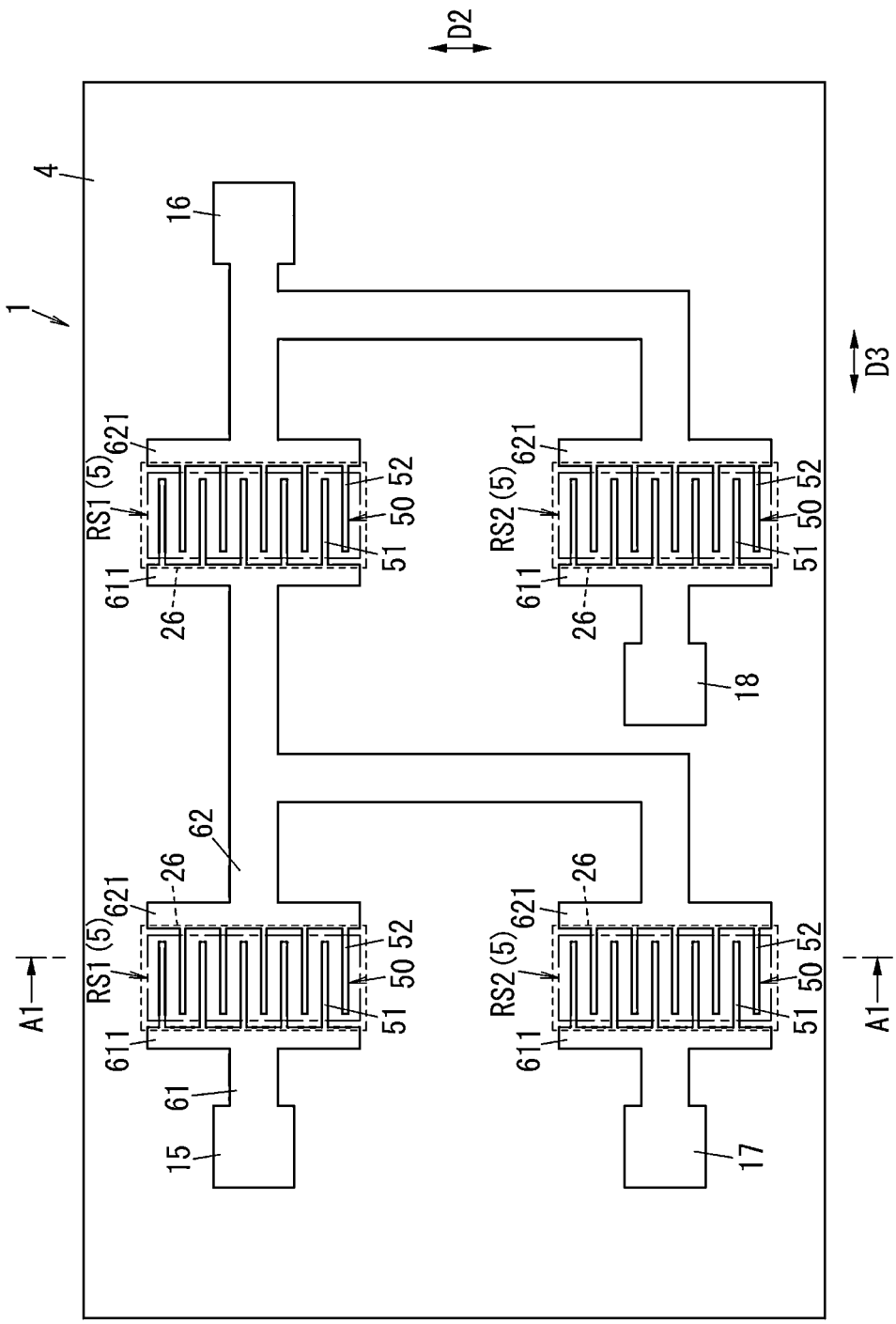
FIG. 1 is a plan view of an acoustic wave device according to a preferred embodiment of the present invention.

Preferred embodiments of the present invention will described below with reference to the drawings.

FIGS. 1 to 9 and FIGS. 15A to 22 referred to in the following preferred embodiments and the like are schematic diagrams, and the ratios of sizes, thicknesses, and the like of the elements in the drawings do not necessarily reflect actual dimensional ratios.

Preferred Embodiment

An acoustic wave device 1 according to a preferred embodiment of the present invention will be described with reference to FIGS. 1 to 14.

(1) Overall Configuration of Acoustic Wave Device

As illustrated in FIG. 1, an acoustic wave device 1 according to the present preferred embodiment includes a piezoelectric layer 4 and a plurality of resonators 5.

Figure 2:
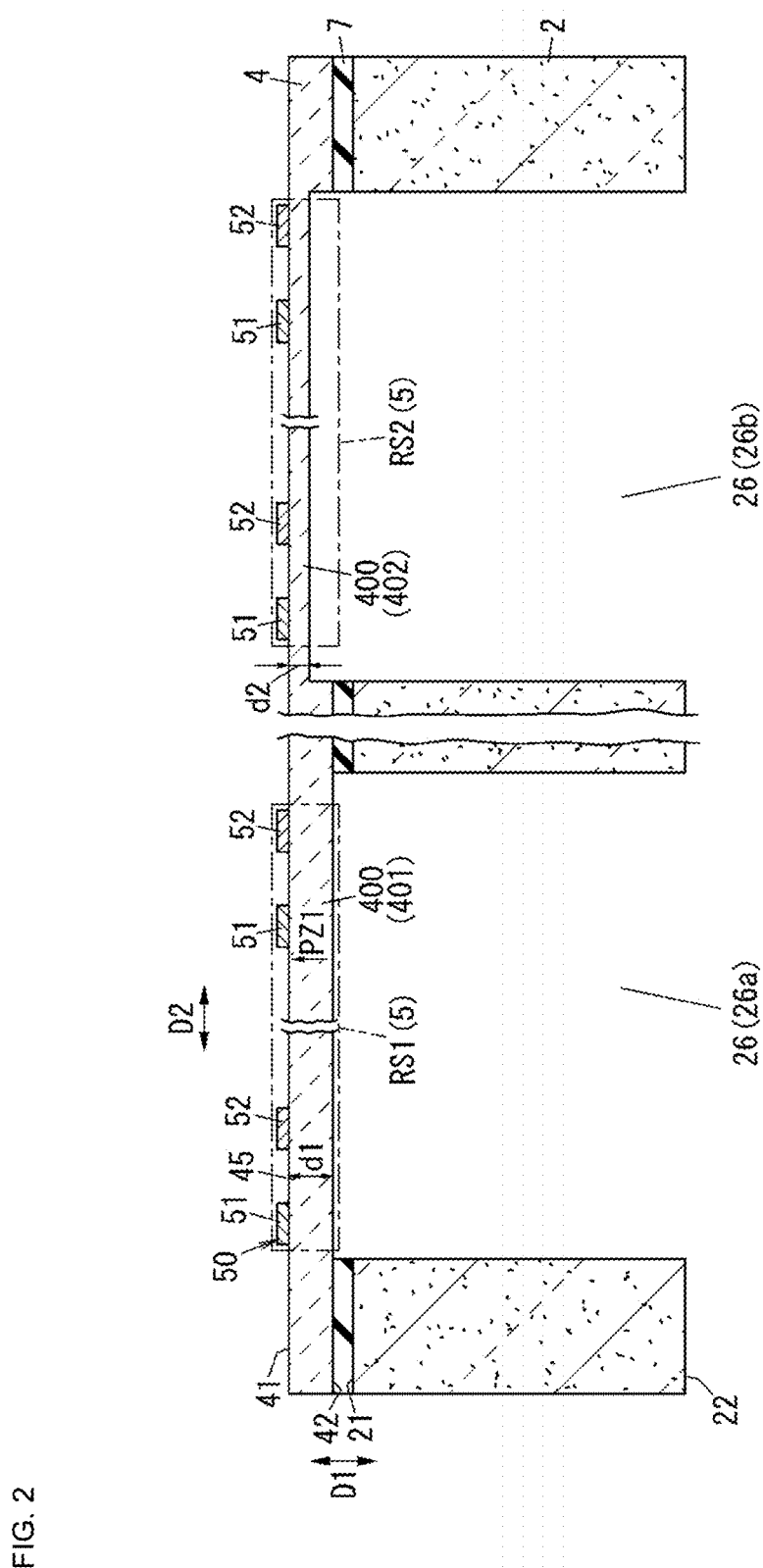
FIG. 2 is a cross-sectional view of the acoustic wave device taken along a line A1-A1 in FIG. 1.
Figure 3:
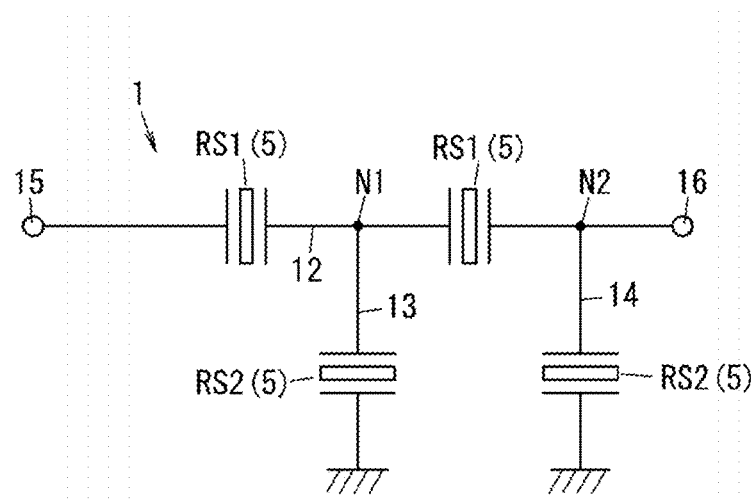
FIG. 3 is an equivalent circuit diagram of the acoustic wave device in FIG. 1.
Figure 4:
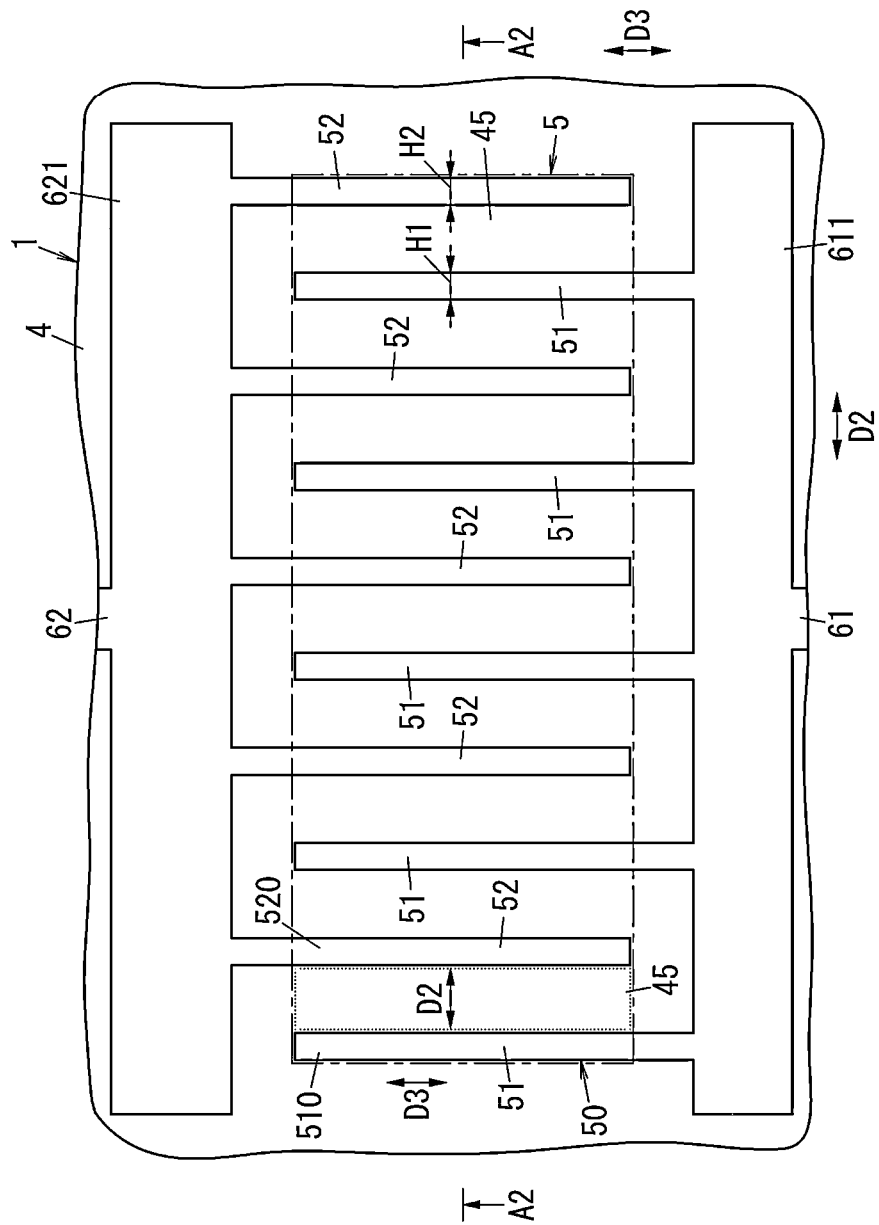
FIG. 4 is a plan view of a resonator included in the acoustic wave device in FIG. 1.

Each of the plurality of resonators 5 is an acoustic wave resonator, and includes a first electrode 51 and a second electrode 52 (see FIG. 4). As illustrated in FIG. 2, the first electrode 51 and the second electrode 52 face each other in a direction D2 (hereinafter, also referred to as a second direction D2) crossing a thickness direction D1 (hereinafter, also referred to as a first direction D1) of the piezoelectric layer 4. The acoustic wave device 1 is an acoustic wave device utilizing a bulk wave of a thickness slip first-order mode. The second direction D2 is orthogonal or substantially orthogonal to a polarization direction PZ1 of the piezoelectric layer 4. The bulk wave of the thickness slip first-order mode is a bulk wave whose propagation direction is in the thickness direction D1 of the piezoelectric layer 4 due to a thickness slip vibration of the piezoelectric layer 4, and the number of nodes in the thickness direction D1 of the piezoelectric layer 4 is one. The thickness slip vibration is excited by the first electrode 51 and the second electrode 52. The thickness slip vibration is excited in the piezoelectric layer 4 in a defined region 45 between the first electrode 51 and the second electrode 52 in a plan view from the thickness direction D1. In the acoustic wave device 1, when the second direction D2 is orthogonal or substantially orthogonal to the polarization direction PZ1 of the piezoelectric layer 4, an electromechanical coupling coefficient (hereinafter, also referred to as a coupling coefficient) of the bulk wave of the thickness slip first-order mode is large. Herein, "orthogonal" is not limited to a case of being strictly orthogonal, and may include being substantially orthogonal (an angle between the second direction D2 and the polarization direction PZ1 is, for example, about 90°±10°).

Figure 6:
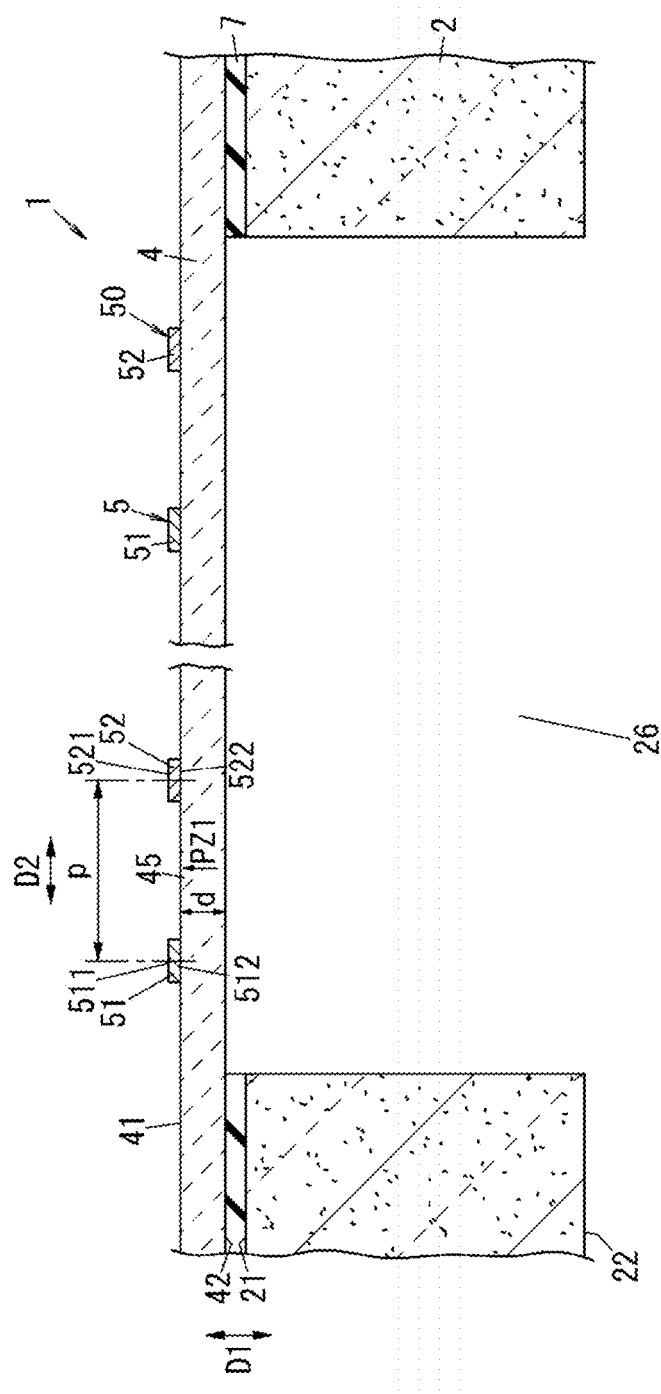
FIG. 6 is a cross-sectional view of the acoustic wave device taken along a line A2-A2 in FIG. 4.

As illustrated in FIGS. 4 and 6, the first electrode 51 and the second electrode 52 included in the resonator 5 intersect with each other when viewed from the second direction D2. The expression "intersect with each other when viewed from the second direction D2" means that the electrodes overlap each other when viewed from the second direction D2. The resonator 5 includes a plurality of the first electrodes 51 and a plurality of the second electrodes 52. That is, each of the plurality of resonators 5 of the acoustic wave device 1 includes a plurality of sets of paired electrodes when the first electrode 51 and the second electrode 52 are denoted as a set of paired electrodes. In each of the plurality of resonators 5 of the acoustic wave device 1, the plurality of first electrodes 51 and the plurality of second electrodes 52 are alternately provided one by one in the second direction D2. As illustrated in FIG. 4, the acoustic wave device 1 further includes, for each of the plurality of resonators 5, a first wiring portion 61, to which the plurality of first electrodes 51 is connected, and a second wiring portion 62, to which the plurality of second electrodes 52 is connected.

As illustrated in FIG. 2, the acoustic wave device 1 includes a support substrate 2, a silicon oxide film 7, the piezoelectric layer 4, and a plurality of electrode portions 50. Each of the plurality of electrode portions 50 includes the first electrode 51 and the second electrode 52. In the acoustic wave device 1, the piezoelectric layer 4 is provided on the support substrate 2. In this case, the support substrate 2 is, for example, a silicon substrate. The piezoelectric layer 4 is bonded to the support substrate 2 with the silicon oxide film 7 interposed therebetween. The support substrate 2 includes a cavity 26. The cavity 26 is directly below the resonator 5. That is, the cavity 26 is provided on the opposite side to the resonator 5 across the piezoelectric layer. The resonator 5 includes the first electrode 51 and the second electrode 52 in a plan view from the thickness direction D1 of the piezoelectric layer 4, and a portion (the defined region 45) between the first electrode 51 and the second electrode 52 in the piezoelectric layer 4 in a plan view from the thickness direction D1 of the piezoelectric layer 4. In the acoustic wave device 1 according to the present preferred embodiment, the cavity 26 extends over the support substrate 2 and the silicon oxide film 7, and exposes a portion of the piezoelectric layer 4 (a portion of a second principal surface 42). The cavity 26 overlaps a portion of the first wiring portion 61 and a portion of the second wiring portion 62 in a plan view from the thickness direction D1 of the piezoelectric layer 4. It is not necessary for the cavity 26 to overlap a portion of the first wiring portion 61 and a portion of the second wiring portion 62 in the plan view from the thickness direction D1 of the piezoelectric layer 4. The expression "the support substrate 2 includes a cavity 26" refers to a case in which a portion of the cavity 6 is surrounded by the support substrate. For example, as illustrated in FIG. 2, in addition to a case in which a portion of the support substrate 2 overlapping the cavity 26 in a plan view of the support substrate 2 is not provided, a case in which the support substrate overlapping the cavity 26 in the plan view of the support substrate 2 is provided is also included.

Each of the plurality of electrode portions 50 is in contact with the piezoelectric layer 4. The resonator 5 of the present preferred embodiment includes the electrode portion 50 including the first electrode 51 and the second electrode 52, and a setting portion 400 including a setup region where the electrode portion 50 is provided in the piezoelectric layer 4.

The acoustic wave device 1 of the present preferred embodiment is an acoustic wave filter (in this case, for example, a ladder filter). The acoustic wave device 1 includes an input terminal 15, an output terminal 16, a plurality of (for example, two) series-arm resonators RS1, and a plurality of (for example, two) parallel-arm resonators RS2. The plurality of (for example, two) series-arm resonators RS1 is provided on a first path 12 connecting the input terminal 15 and the output terminal 16 (see FIG. 3). The plurality of (for example, two) parallel-arm resonators RS2 is provided on a plurality of (for example, two) paths including second paths 13 and 14, respectively, connecting a plurality of (two) nodes including nodes N1 and N2 on the first path 12 to the ground (ground terminals 17 and 18) (see FIG. 3). The ground terminals 17 and 18 may be defined by one ground and shared.

In the acoustic wave device 1, each of the pluralities of series-arm resonators RS1 and parallel-arm resonators RS2 is the resonator 5. Each of the plurality of resonators 5 includes the first electrode 51 and the second electrode 52. The resonant frequency of the parallel-arm resonator RS2 is higher than that of the series-arm resonators RS1.

(2) Elements of Acoustic Wave Device

Next, elements of the acoustic wave device 1 will be described with reference to the accompanying drawings.

(2.1) Support Substrate

As illustrated in FIG. 2, the support substrate 2 supports the piezoelectric layer 4 with the silicon oxide film 7 interposed therebetween. In the acoustic wave device 1 according to the present preferred embodiment, the support substrate 2 supports the plurality of electrode portions 50 with the silicon oxide film 7 and the piezoelectric layer 4 interposed therebetween. That is, the support substrate 2 supports the first electrodes 51 and the second electrodes 52 included in each of the plurality of electrode portions 50 with the piezoelectric layer 4 interposed therebetween.

The support substrate 2 includes a first principal surface 21 and a second principal surface 22 facing each other. The first principal surface 21 and the second principal surface 22 face each other in the thickness direction of the support substrate 2. The thickness direction of the support substrate 2 is a direction along the thickness direction D1 of the piezoelectric layer 4. In a plan view from the thickness direction D1 of the piezoelectric layer 4, the outer peripheral shape of the support substrate 2 is a rectangular or substantially rectangular shape, but is not limited thereto, and may be, for example, a square or substantially square shape.

The support substrate 2 is, for example, a silicon substrate. The thickness of the support substrate 2 is, for example, in a range from about 100 μm to about 500 μm, and is about 120 μm as an example. The silicon substrate is, for example, a single crystal silicon substrate. In the case where the support substrate 2 is a silicon substrate, the plane orientation of the first principal surface 21 may be, for example, a (100) plane, (110) plane, or (111) plane. The propagation orientation of the bulk wave described above may be set without being restricted by the plane orientation of the silicon substrate. The resistivity of the silicon substrate is, for example, not less than about 1 kΩcm, preferably not less than about 2 kΩcm, and more preferably not less than about 4 kΩcm.

The support substrate 2 is not limited to a silicon substrate, and may be, for example, a quartz substrate, a glass substrate, a sapphire substrate, a lithium tantalate substrate, a lithium niobate substrate, an alumina substrate, a spinel substrate, a gallium arsenide substrate, or a silicon carbide substrate.

The support substrate 2 includes at least a portion of the cavity 26 configured to expose a portion of the piezoelectric layer 4. The cavity 26 overlaps the resonator 5 in a plan view from the thickness direction D1 of the piezoelectric layer 4. In the acoustic wave device 1 according to the present preferred embodiment, the cavity 26 is larger than the resonator 5 and overlaps the entire resonator 5 in a plan view from the thickness direction D1 of the piezoelectric layer 4. In the acoustic wave device 1 according to the present preferred embodiment, the cavity 26 also overlaps a portion of the first wiring portion 61 and a portion of the second wiring portion 62 in the plan view from the thickness direction D1 of the piezoelectric layer 4. In the plan view from the thickness direction D1 of the piezoelectric layer 4, the opening shape of the cavity 26 is a rectangular or substantially rectangular shape, but is not limited thereto.

In the present preferred embodiment, the support substrate 2 includes a first cavity 26a and a second cavity 26b. The first cavity 26a exposes at least a portion of the piezoelectric layer 4. The second cavity 26b exposes at least a portion of the piezoelectric layer 4. In the present preferred embodiment, both the first cavity 26a and the second cavity 26b expose at least a portion of the piezoelectric layer 4, but it is acceptable that the piezoelectric layer 4 is not exposed at all. In other words, a dielectric film or the like may be laminated on a surface on the first cavity 26a side of the piezoelectric layer 4 and a surface on the second cavity 26b side of the piezoelectric layer 4 in a region where the piezoelectric layer 4 overlaps the first cavity 26a and a region where the piezoelectric layer 4 overlaps the second cavity 26b, respectively, in a plan view.

The first cavity 26a overlaps, in a plan view from the thickness direction D1, the first electrode 51 and second electrode 52 of the series-arm resonator RS1, and a portion between the first electrode 51 and the second electrode 52 of the series-arm resonator RS1 in the piezoelectric layer 4. In the plan view from the thickness direction D1, the second cavity 26b overlaps the first electrode 51 and the second electrode 52 of the parallel-arm resonator RS2, and a portion between the first electrode 51 and the second electrode 52 of the parallel-arm resonator RS2 in the piezoelectric layer 4.

(2.2) Silicon Oxide Film

The silicon oxide film 7 is provided between the first principal surface 21 of the support substrate 2 and the piezoelectric layer 4. In the acoustic wave device 1 according to the present preferred embodiment, the silicon oxide film 7 overlaps the entire or substantially the entire first principal surface 21 of the support substrate 2 in the thickness direction D1 of the piezoelectric layer 4. In the acoustic wave device 1 according to the present preferred embodiment, the support substrate 2 and the piezoelectric layer 4 are bonded to each other with the silicon oxide film 7 interposed therebetween.

The thickness of the silicon oxide film 7 is, for example, not less than about 0.1 μm and not more than about 10 μm.

(2.3) Piezoelectric Layer

As illustrated in FIG. 2, the piezoelectric layer 4 includes a first principal surface 41 and the second principal surface 42 facing each other. The first principal surface 41 and the second principal surface 42 face each other in the thickness direction D1 of the piezoelectric layer 4. In the piezoelectric layer 4, of the first principal surface 41 and the second principal surface 42, the first principal surface 41 is located on the first electrode 51 side and second electrode 52 side, and the second principal surface 42 is located on the silicon oxide film 7 side. Accordingly, in the acoustic wave device 1, the distance from the first principal surface 41 of the piezoelectric layer 4 to the silicon oxide film 7 is longer than the distance from the second principal surface 42 of the piezoelectric layer 4 to the silicon oxide film 7. That is, in the acoustic wave device 1, the distance from the first principal surface 41 of the piezoelectric layer 4 to the support substrate 2 is longer than the distance from the second principal surface 42 of the piezoelectric layer 4 to the support substrate 2. The material of the piezoelectric layer 4 is, for example, lithium niobate ($LiNbO_3$) or lithium tantalate ($LiTaO_3$). The piezoelectric layer 4 is, for example, a Z-cut $LiNbO_3$ or Z-cut $LiTaO_3$. With regard to the Euler angles (φ, θ, ψ) of the piezoelectric layer 4, for example, φ is about 0°±10° and θ is about 0°±10°. ψ takes any angle. From the viewpoint of increasing the coupling coefficient, the piezoelectric layer 4 is preferably, for example, a Z-cut $LiNbO_3$ or Z-cut $LiTaO_3$. The piezoelectric layer 4 may be a rotated Y-cut $LiNbO_3$, a rotated Y-cut $LiTaO_3$, an X-cut $LiNbO_3$, or an X-cut $LiTaO_3$. The propagation orientation may be, for example, a Y-axis direction, an X-axis direction, or a direction rotated within a range of about ±90° from the X-axis in the crystal axes (X, Y, Z) defined for the crystal structure of the piezoelectric layer 4. The piezoelectric layer 4 is a single crystal, but is not limited thereto, and may be a twin crystal or ceramics, for example.

The thickness of the piezoelectric layer 4 is, for example, in a range from about 50 nm to about 1000 nm, and is about 400 nm as an example.

Figure 5:
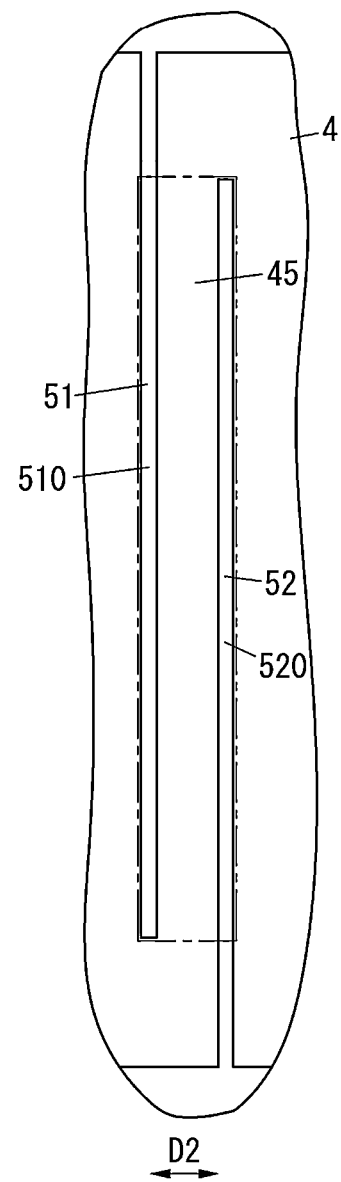
FIG. 5 is a plan view of a main section of the resonator in FIG. 1.

The piezoelectric layer 4 includes the defined region 45 (see FIG. 5). In a plan view from the thickness direction D1 of the piezoelectric layer 4, the defined region 45 is a region intersecting with both the first electrode 51 and the second electrode 52 in a direction in which the first electrode 51 and the second electrode 52 face each other in the piezoelectric layer 4, and located between the first electrode 51 and the second electrode 52.

In the present preferred embodiment, a thickness d1 of one resonator 5 (for example, the series-arm resonator RS1) among the plurality of resonators 5 differs from a thickness d2 of another resonator 5 (for example, the parallel-arm resonator RS2) different from the one resonator 5 among the plurality of resonators 5. In this case, the thickness of each of the plurality of resonators 5 is a thickness excluding the thickness of the first electrode 51 and the second electrode 52 included in the resonator 5.

Specifically, within the piezoelectric layer 4, for example, the thickness d1 of the piezoelectric layer 4 in the region (setting portion 400) where the resonator 5 as the series-arm resonator RS1 is provided is different from the thickness d2 of the piezoelectric layers 4 in the region (setting portion 400) where the resonator 5 as the parallel-arm resonator RS2 is provided. That is, the thickness d1 of a setting portion 401 of the series-arm resonator RS1 is different from the thickness d2 of a setting portion 402 of the parallel-arm resonator RS2. The thickness of the piezoelectric layer 4 at the setting portion 400 is a thickness of the piezoelectric layer 4 in a region overlapping the first electrode 51 and the second electrode 52 at the setting portion 400 when the acoustic wave device 1 is viewed in a plan view. In the present preferred embodiment, the thickness d1 of the setting portion 401 is larger than the thickness d2 of the setting portion 402. In the present preferred embodiment, a difference in level is provided on the second principal surface 42 such that the thickness d1 of the setting portion 401 is larger than the thickness d2 of the setting portion 402. The thickness d2 of the setting portion 402 may be larger than the thickness d1 of the setting portion 401.

Herein, a difference value between the thickness d1 of the setting portion 401 and the thickness d2 of the setting portion 402 is preferably less than 100% with respect to the thickness d1.

(2.4) Electrode

The acoustic wave device 1 includes the plurality of electrode portions 50. Each of the plurality of electrode portions 50 includes the first electrode 51 and the second electrode 52. Hereinafter, one electrode portion 50 will be described because the plurality of electrode portions 50 have the same or substantially the same configuration.

The electrode portion 50 includes the first electrode 51 and the second electrode 52. In the present preferred embodiment, the electrode portion 50 includes the plurality of first electrodes 51 and the plurality of second electrodes 52.

In the acoustic wave device 1, of the first electrode 51 and the second electrode 52, the first electrode 51 is a hot electrode and the second electrode 52 is a ground electrode, for example. In the acoustic wave device 1, the plurality of first electrodes 51 and the plurality of second electrodes 52 are alternately provided one by one, and separated from each other. Thus, the first electrode 51 and the second electrode 52 adjacent to each other are separated from each other. The distance between the center lines of the first electrode 51 and the second electrode 52 is, for example, in a range from about 1 μm to about 10 μm, and is about 3 μm as an example. It is sufficient for a group of electrodes including the plurality of first electrodes 51 and the plurality of second electrodes 52 to be configured such that the plurality of first electrodes 51 and the plurality of second electrodes 52 are separated from each other in the second direction D2, and the group of electrodes may be configured such that the plurality of first electrodes 51 and the plurality of second electrodes 52 are not alternately provided and separated from each other. For example, a region where the first electrodes 51 and the second electrodes 52 are provided one by one and separated from each other and a region where two or more of the first electrodes 51 or two or more of the second electrodes 52 are provided in the second direction D2, may be mixed. Here, a situation in which the first electrode 51 and the second electrode 52 are "adjacent to each other" refers to a case in which the first electrode 51 and the second electrode 52 face each other with a gap interposed therebetween.

The plurality of first electrodes 51 and the plurality of second electrodes 52 have an elongated (linear) shape in a plan view from the thickness direction D1 of the piezoelectric layer 4, as illustrated in FIG. 4, where a third direction D3 orthogonal or substantially orthogonal to the second direction D2 is denoted as a longitudinal direction, and the second direction D2 is denoted as a width direction. The length of each of the plurality of first electrodes 51 is, for example, about 20 μm, but is not limited thereto. A width H1 (a first electrode width H1) of each of the plurality of first electrodes 51 is, for example, in a range from about 50 nm to about 1000 nm, and is about 500 nm as an example. The length of each of the plurality of second electrodes 52 is, for example, about 20 μm, but is not limited thereto. A width H2 (a second electrode width H2) of each of the plurality of second electrodes 52 is, for example, in a range from about 50 nm to about 1000 nm, and is about 500 nm as an example.

The plurality of first electrodes 51 and the plurality of second electrodes 52 are provided on the first principal surface 41 of the piezoelectric layer 4. That is, the electrode portion is provided on the first principal surface 41 of the piezoelectric layer 4. The first electrode 51 and the second electrode 52 face each other on the same principal surface (in this case, the first principal surface 41) of the piezoelectric layer 4.

The first electrode 51 includes a first electrode principal portion 510. The first electrode principal portion 510 is a portion of the first electrode 51 intersecting with the second electrode 52 in a direction in which the first electrode 51 and the second electrode 52 face each other. The second electrode 52 includes a second electrode principal portion 520. The second electrode principal portion 520 is a portion of the second electrode 52 intersecting with the first electrode 51 in the direction in which the first electrode 51 and the second electrode 52 face each other.

In the acoustic wave device 1 according to the present preferred embodiment, the plurality of first electrodes 51 have the same or substantially the same first electrode width H1, but is not limited thereto, and may have different widths. In the acoustic wave device 1 according to the present preferred embodiment, the plurality of second electrodes 52 have the same or substantially the same second electrode width H2, but is not limited thereto, and may have different widths. In the acoustic wave device 1 according to the present preferred embodiment, the first electrode width H1 and the second electrode width H2 are equal or substantially equal to each other, but are not limited thereto; the first electrode width H1 may differ from the second electrode width H2.

With regard to the acoustic wave device 1 according to the present preferred embodiment, although the number of first electrodes 51 and the number of second electrodes 52 are each, for example, five in the drawing of FIG. 1, the number of first electrodes 51 and the number of second electrodes 52 are not limited to five, and may be, for example, one, two to four, six or more, or fifty or more.

The second direction D2 in which the first electrode 51 and the second electrode 52 face each other is preferably orthogonal or substantially orthogonal to the polarization direction PZ1 (see FIG. 2) of the piezoelectric layer 4, but is not limited thereto. For example, when the piezoelectric layer 4 is not a Z-cut piezoelectric body, the first electrode 51 and the second electrode 52 may face each other in a direction orthogonal or substantially orthogonal to the third direction D3, which is the longitudinal direction. The first electrode 51 and the second electrode 52 may not be rectangular or substantially rectangular in some case. In this case, when the first electrode 51 and the second electrode 52 are seen in a plan view, the third direction D3, which is the longitudinal direction, may be a long side direction of a circumscribed polygon that circumscribes portions of the first electrode 51 and the second electrode 52 excluding a portion connected to the first wiring portion 61 or the second wiring portion 62. When the first wiring portion 61 is connected to the first electrode 51 and the second wiring portion 62 is connected to the second electrode 52, the "circumscribed polygon that circumscribes the first electrode 51 and the second electrode 52" includes a polygon at least circumscribing portions of the first electrode 51 excluding the portion connected to the first wiring portion 61 and portions of the second electrode 52 excluding the portion connected to the second wiring portion 62.

In the acoustic wave device 1 according to the present preferred embodiment, the thickness of each of the plurality of first electrodes 51 is smaller than the thickness of the piezoelectric layer 4. Each of the plurality of first electrodes 51 includes a first principal surface 511 and a second principal surface 512 crossing the thickness direction D1 of the piezoelectric layer 4. In each of the plurality of first electrodes 51, the second principal surface 512 is in contact with the piezoelectric layer 4 in a sheet shape.

In the acoustic wave device 1 according to the present preferred embodiment, the thickness of each of the plurality of second electrodes 52 is smaller than the thickness of the piezoelectric layer 4. Each of the plurality of second electrodes 52 includes a first principal surface 521 and a second principal surface 522 crossing the thickness direction D1 of the piezoelectric layer 4. In each of the plurality of second electrodes 52, the second principal surface 522 is in contact with the piezoelectric layer 4 in a sheet shape.

The plurality of first electrodes 51 and the plurality of second electrodes 52 are electrically conductive. The material of the first electrode 51 and the second electrode 52 is, for example, aluminum (Al), copper (Cu), platinum (Pt), gold (Au), silver (Ag), titanium (Ti), nickel (Ni), chromium (Cr), molybdenum (Mo), tungsten (W), or an alloy including any of these metals as a main ingredient. The first electrode 51 and the second electrode 52 may have a structure in which a plurality of metal films made of these metals or alloys are laminated. The first electrode 51 and the second electrode 52 each include, for example, a laminated film including a close contact film made of a Ti film and a main electrode film made of an Al film or an AlCu film on the close contact film. The close contact film has a thickness of, for example, about 10 nm. The main electrode film has a thickness of, for example, about 80 nm. In the AlCu film, it is preferable for Cu to be, for example, about 1 wt % to about 20 wt %.

(2.5) First Wiring Portion and Second Wiring Portion

The first wiring portion 61 includes a first busbar 611. The first busbar 611 is a conductor portion configured to make the plurality of first electrodes 51 have the same potential. The first busbar 611 has an elongated shape (linear shape) whose longitudinal direction is the second direction D2. The plurality of first electrodes 51 connected to the first busbar 611 extend toward a second busbar 621. In the acoustic wave device 1, a first conductor portion including the plurality of first electrodes 51 and the first busbar 611 has a comb shape in a plan view from the thickness direction D1 of the piezoelectric layer 4. The first busbar 611 is integrally provided with the plurality of first electrodes 51, but is not limited thereto.

The second wiring portion 62 includes the second busbar 621. The second busbar 621 is a conductor portion configured to make the plurality of second electrodes 52 have the same potential. The second busbar 621 has an elongated shape (linear shape) whose longitudinal direction is the second direction D2. The plurality of second electrodes 52 connected to the second busbar 621 extend toward the first busbar 611. In the acoustic wave device 1, a second conductor portion including the plurality of second electrodes 52 and the second busbar 621 has a comb shape in a plan view from the thickness direction D1 of the piezoelectric layer 4. The second busbar 621 is integrally provided with the plurality of second electrodes 52, but is not limited thereto.

The first busbar 611 and the second busbar 621 face each other in the third direction D3. The third direction D3 is a direction orthogonal or substantially orthogonal to both the first direction D1 and the second direction D2.

The first wiring portion 61 and the second wiring portion 62 are electrically conductive. The material of the first wiring portion 61 and the second wiring portion 62 is, for example, Al, Cu, Pt, Au, Ag, Ti, Ni, Cr, Mo, W, or an alloy including any of these metals as a main ingredient. The first wiring portion 61 and the second wiring portion 62 may have a structure in which a plurality of metal films made of these metals or alloys are laminated. The first wiring portion 61 and the second wiring portion 62 each include, for example, a laminated film including a close contact film made of a Ti film and a main wiring film made of an Al film or an AlCu film formed on the close contact film. The close contact film has a thickness of, for example, about 10 nm. The main wiring film has a thickness of, for example, about 80 nm. In the AlCu film, it is preferable, for example, for Cu to be about wt % 1 to about 20 wt %.

In the acoustic wave device 1, each of the first busbar 611 and the second busbar 621 may include a metal film on the main wiring film from the viewpoint of reducing the resistance of the first busbar 611 and the second busbar 621.

(3) Manufacturing Method for Acoustic Wave Device

In a non-limiting example of a manufacturing method for the acoustic wave device 1, for example, after the support substrate 2 is prepared, first to fifth steps are performed. In the first step, a silicon oxide film is formed on the first principal surface 21 of the support substrate 2. In the second step, a piezoelectric substrate from which the piezoelectric layer 4 is formed and the support substrate 2 are bonded to each other with a silicon oxide film interposed therebetween. In the third step, the piezoelectric substrate is thinned to have a predetermined thickness of the piezoelectric layer 4. In the fourth step, the plurality of first electrodes 51, the plurality of second electrodes 52, the first wiring portion 61, and the second wiring portion 62 are formed on the piezoelectric layer 4. In the fourth step, the plurality of first electrodes 51, the plurality of second electrodes 52, the first wiring portion 61, and the second wiring portion 62 are formed using, for example, a photolithography technique, an etching technique, a thin film forming technique, or the like. In the fifth step, the cavity 26 is formed in the support substrate 2. In the fifth step, a region of the support substrate 2 where the cavity 26 is to be formed is etched using, for example, an etching technique or the like. In the fifth step, etching is performed with the silicon oxide film being an etching stopper layer, and then an unnecessary portion of the silicon oxide film is removed by etching to expose a portion of the second principal surface 42 of the piezoelectric layer 4. Further, in the fifth step, masking is performed on the cavity 26 (first cavity 26a) overlapping the series-arm resonator RS1 when viewed from the first direction D1 among a plurality of the cavities 26, and a region of the piezoelectric layer 4 overlapping the parallel-arm resonator RS2 when viewed from the first direction D1 is etched. With this, when viewed from the first direction D1, the thickness of the setting portion 401, which is a region of the piezoelectric layer 4 overlapping the series-arm resonator RS1, and the thickness of the setting portion 402, which is a region of the piezoelectric layer 4 overlapping the parallel-arm resonator RS2, may be made different from each other. In the first step to the fifth step, a silicon wafer is used as the support substrate 2, and a piezoelectric wafer is used as the piezoelectric substrate. In the manufacturing method for the acoustic wave device 1, a wafer including a plurality of the acoustic wave devices 1 is cut with, for example, a dicing machine to obtain the plurality of acoustic wave devices 1 (chips).

The manufacturing method for the acoustic wave device 1 is merely an example, and is not particularly limited. For example, the piezoelectric layer 4 may be formed using a film-forming technique. In this case, the manufacturing method for the acoustic wave device 1 includes a step of film-forming the piezoelectric layer 4, instead of the second step and the third step. The piezoelectric layer 4 film-formed by the film-forming technique may be, for example, a single crystal or twin crystal. Examples of the film-forming technique include, but are not limited to, a chemical vapor deposition (CVD) method.

(4) Operations and Characteristics of Acoustic Wave Device

The acoustic wave device 1 according to the present preferred embodiment is an acoustic wave device utilizing a bulk wave of a thickness slip first-order mode. As described above, the bulk wave of the thickness slip first-order mode is a bulk wave whose propagation direction is the thickness direction D1 of the piezoelectric layer 4 produced by a thickness slip vibration of the piezoelectric layer 4, and the number of nodes in the thickness direction D1 of the piezoelectric layer 4 is one. The thickness slip vibration is excited by the first electrode 51 and the second electrode 52. The thickness slip vibration is excited in the piezoelectric layer 4 in the defined region 45 between the first electrode 51 and the second electrode 52 in a plan view from the thickness direction D1. The thickness slip vibration may be confirmed by, for example, a finite element method (FEM). More specifically, the thickness slip vibration may be confirmed by, for example, analyzing strain through analyzing a displacement distribution by FEM using parameters of the piezoelectric layer 4 (material, Euler angles, thickness, and the like), parameters of the first electrode 51 and the second electrode 52 (material, thickness, distance between center lines of the first electrode 51 and the second electrode 52, and the like), and the like. The Euler angles of the piezoelectric layer 4 may be obtained by analysis.

Here, a difference between a Lamb wave utilized in an acoustic wave device of the related art and the bulk wave of the thickness slip first-order mode will be described with reference to FIGS. 7A and 7B.

Figure 7A:
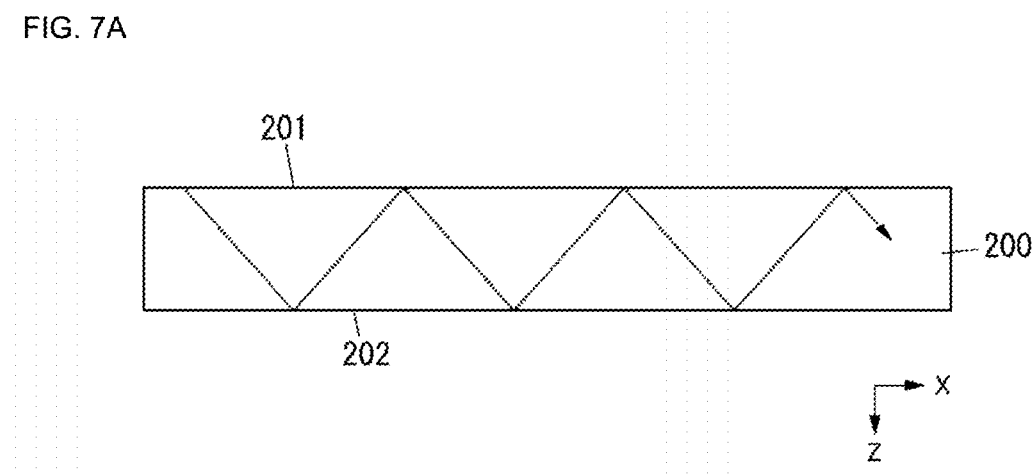
FIG. 7A is an explanatory diagram of a Lamb wave.

FIG. 7A is a schematic elevational cross-sectional view for explaining a Lamb wave propagating through a piezoelectric film of an acoustic wave device of the related art, such as the surface acoustic wave device described in Japanese Unexamined Patent Application Publication No. 2012-257019. In the acoustic wave device of the related art, an acoustic wave propagates through a piezoelectric thin film 200 as indicated by an arrow. The piezoelectric thin film 200 includes a first principal surface 201 and a second principal surface 202 facing each other. In FIG. 7A, a Z direction and an X direction are illustrated in addition to the piezoelectric thin film 200. In FIG. 7A, the Z direction is a thickness direction of the piezoelectric thin film 200 connecting the first principal surface 201 and second principal surface 202. The X direction is a direction in which a plurality of electrode fingers of an IDT electrode is arranged. The Lamb wave is a plate wave in which an acoustic wave propagates in the X direction as illustrated in FIG. 7A. Accordingly, in the acoustic wave device of related art, because the acoustic wave propagates in the X direction, two reflectors are respectively disposed on both sides of the IDT electrode to obtain desired resonance characteristics. This causes propagation loss of the acoustic wave in the acoustic wave device of the related art. Therefore, when miniaturization is achieved, that is, when the number of pairs of electrode fingers is reduced, the Q value is lowered.

Figure 7B:
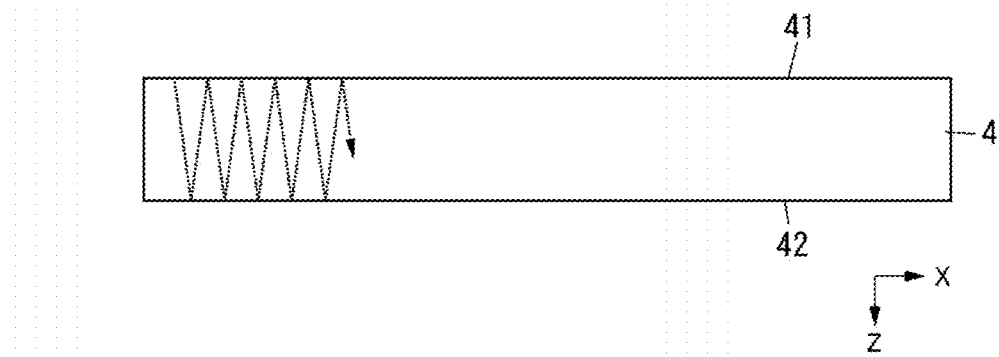
FIG. 7B is an explanatory diagram of a bulk wave of a thickness slip first-order mode.

On the other hand, in the acoustic wave device 1 according to the present preferred embodiment, because the vibration displacement is made in the thickness slip direction, the acoustic wave propagates in a direction connecting the first principal surface 41 and the second principal surface 42 of the piezoelectric layer 4, that is, propagates in or substantially in the Z direction and resonates, as illustrated in FIG. 7B. That is, an X-direction component of the acoustic wave is significantly smaller than a Z-direction component thereof. In the acoustic wave device 1 according to Preferred Embodiment 1, because resonance characteristics are obtained by the propagation in the Z direction of the acoustic wave, reflectors are not necessarily required. Therefore, in the acoustic wave device 1 according to the present preferred embodiment, no propagation loss generated when the acoustic wave propagates to reflectors occurs. Thus, in the acoustic wave device 1 according to present preferred embodiment, even when the number of electrode pairs each including the first electrode 51 and the second electrode 52 is reduced in order to reduce the size of the device, the Q value is unlikely to be reduced.

Figure 8:
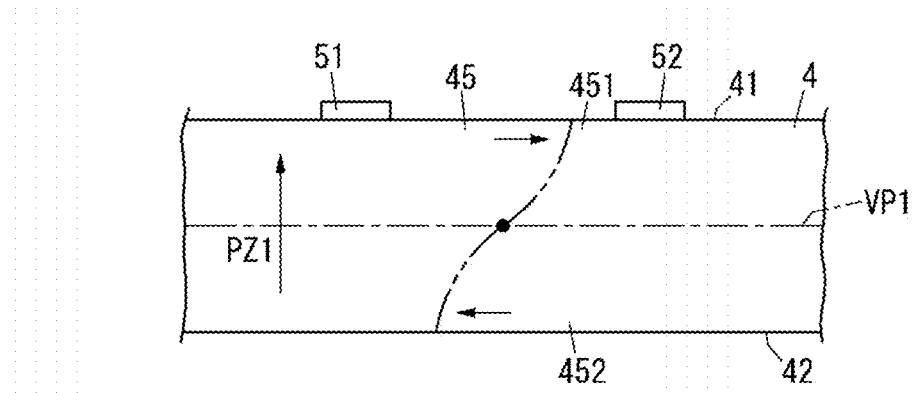
FIG. 8 is an explanatory diagram of an operation of the acoustic wave device in FIG. 1.
Figure 9:
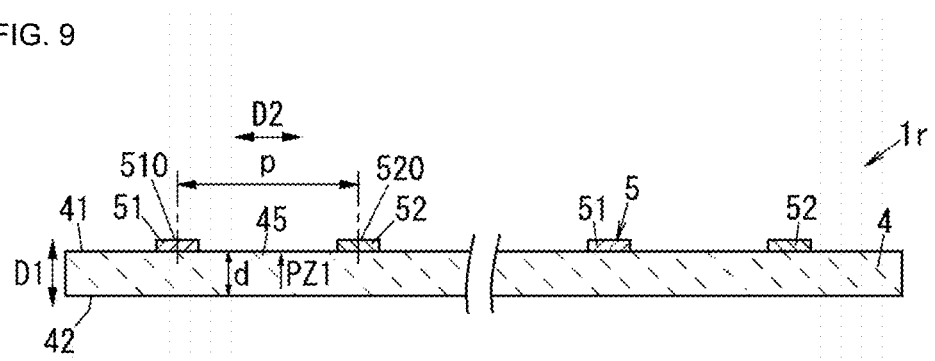
FIG. 9 is an explanatory diagram of a structural model of an acoustic wave device according to a reference configuration.

In each resonator 5 of the acoustic wave device 1 according to the present preferred embodiment, as illustrated in FIG. 8, an amplitude direction of the bulk wave of the thickness slip first-order mode in a first region 451 included in the defined region 45 of the piezoelectric layer 4 is opposite to an amplitude direction thereof in a second region 452 included in the defined region 45 of the piezoelectric layer 4. In FIG. 8, a two-dot chain line schematically indicates the bulk wave when a voltage that causes a potential of the second electrode 52 to be higher than that of the first electrode 51 is applied between the first electrode 51 and the second electrode 52. The first region 451 is a region of the defined region 45 between the first principal surface 41 and a virtual plane VP1, which is orthogonal or substantially orthogonal to the thickness direction D1 of the piezoelectric layer 4 and divides the piezoelectric layer 4 into two.

The second region 452 is a region of the defined region 45 between the virtual plane VP1 and the second principal surface 42.

Characteristics of a structural model 1r (see FIG. 9) of an acoustic wave device according to a reference configuration utilizing a bulk wave of the thickness slip first-order mode were simulated. As for the structural model 1r, the same or corresponding elements as those of the acoustic wave device 1 according to the present preferred embodiment are denoted by the same reference signs, and description thereof will be omitted.

The structural model 1r differs from the acoustic wave device 1 according to the present preferred embodiment in that the first wiring portion 61 and the second wiring portion 62 are not provided. Further, the structural model 1r includes one resonator 5. In the simulation, the number of pairs of the first electrode 51 and the second electrode 52 was infinite, and the piezoelectric layer 4 was provided of a 120° rotated Y-cut X-propagation $LiNbO_3$.

In the structural model 1r, the piezoelectric layer 4 is a membrane, and the second principal surface 42 of the piezoelectric layer 4 is in contact with air. In the structural model 1r, in a cross section along the thickness direction D1 of the piezoelectric layer 4 (see FIG. 8), the distance between the center lines of the first electrode 51 and the second electrode 52 adjacent to each other was represented by p, and the thickness of the piezoelectric layer 4 was represented by d. In the structural model 1r, in a plan view from the thickness direction D1 of the piezoelectric layer 4, an area of the first electrode principal portion 510 was S1, an area of the second electrode principal portion 520 was S2, an area of the defined region 45 was S0, and a structural parameter defined by (S1+S2)/(S1+S2+S0) was MR. In a case where at least either multiple first electrodes 51 or multiple second electrodes 52 are provided in the piezoelectric layer 4, the distance p between the center lines refers to each distance between the center lines of the first electrode 51 and the second electrode 52 adjacent to each other.

Figure 10A:
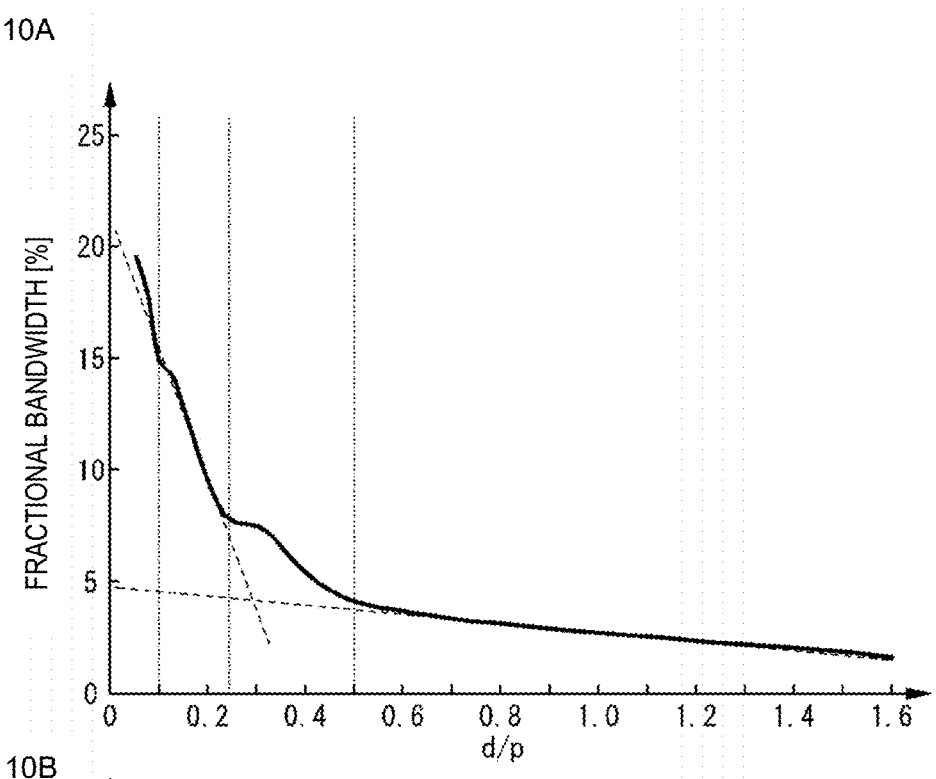
FIG. 10A is a graph showing a relationship between a fractional bandwidth of a thickness slip mode and an expression of [a thickness of a piezoelectric layer]/[a distance between center lines of a first electrode and a second electrode] with regard to the acoustic wave device.
Figure 10B:
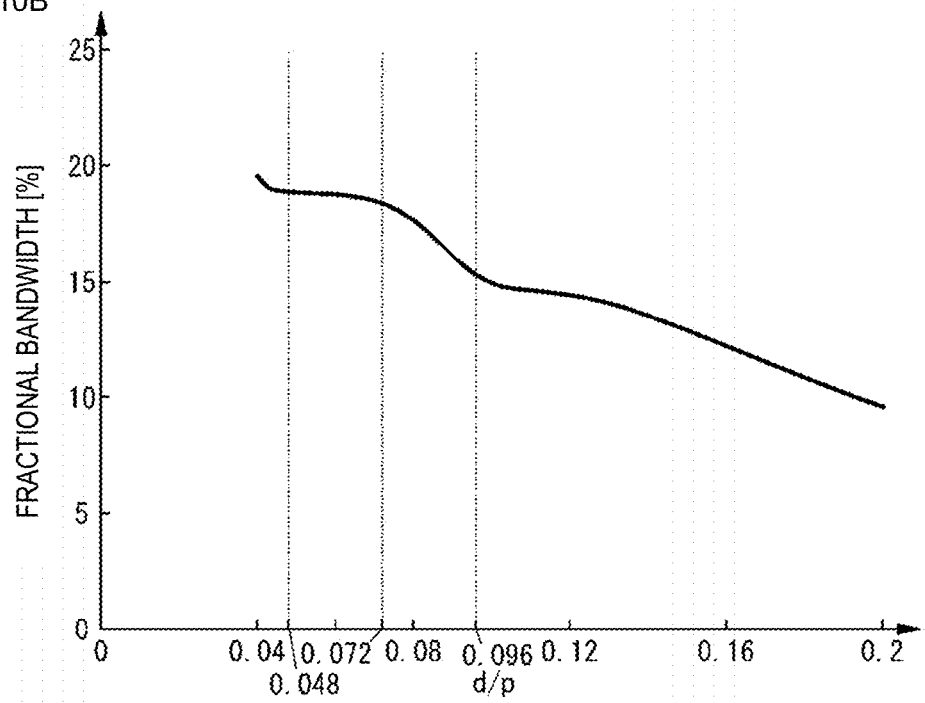
FIG. 10B is a graph showing the relationship between the fractional bandwidth of the thickness slip mode and an expression of [the thickness of the piezoelectric layer]/[the distance between the center lines of two electrodes forming a pair] with regard to the structural model described above, and is a graph obtained by enlarging a range from about 0 to about 0.2 on the horizontal axis of FIG. 10A.

FIGS. 10A and 10B are graphs showing a relationship between a fractional bandwidth and d/p when different potentials are applied to the first electrode 51 and the second electrode 52 with regard to the structural model 1r. In each of FIGS. 10A and 10B, the horizontal axis represents d/p and the vertical axis represents the fractional bandwidth. FIGS. 10A and 10B correspond to a case where the piezoelectric layer 4 is a 120° rotated Y-cut X-propagation $LiNbO_3$, and the same or substantially the same tendency is observed in the cases of other cut-angles. In the structural model 1r of the acoustic wave device, even when the material of the piezoelectric layer 4 is $LiTaO_3$, the relationship between the fractional bandwidth and d/p has the same or substantially the same tendency as that in FIGS. 10A and 10B. In the structural model 1r of the acoustic wave device, the relationship between the fractional bandwidth and d/p has the same or substantially the same tendency as that of FIGS. 10A and 10B regardless of the number of pairs of the first electrode 51 and the second electrode 52. Further, in the structural model 1r of the acoustic wave device, in addition to the case where the second principal surface 42 of the piezoelectric layer 4 is in contact with air, in a case where the second principal surface 42 thereof is in contact with an acoustic reflection layer, the relationship between the fractional bandwidth and d/p has the same or substantially the same tendency as that in FIGS. 10A and 10B.

It may be understood from FIG. 10A that, in the structural model 1r of the acoustic wave device, the value of the fractional bandwidth changes drastically when taking a point at d/p=about 0.5 as an inflection point. In the structural model 1r of the acoustic wave device, when d/p is greater than about 0.5, the coupling coefficient is low and the fractional bandwidth is less than about 5% regardless of the magnitude of the change of d/p within a range of about 0.5<d/p<about 1.6. On the other hand, in the structural model 1r of the acoustic wave device, in a case of d/p about≤0.5, it is possible to increase the coupling coefficient and set the fractional bandwidth to be about 5% or more by changing d/p within a range of about 0<d/p≤about 0.5.

In the structural model 1r of the acoustic wave device, in a case of d/p≤about 0.24, it is possible to further increase the coupling coefficient and set the fractional bandwidth to be larger by changing d/p within a range of about 0<d/p≤about 0.24. In each of the resonators 5 of the acoustic wave device 1 according to the present preferred embodiment, as illustrated in FIG. 6, in an optional cross section along the thickness direction D1 of the piezoelectric layer 4, when the distance between the center lines of the first electrode 51 and the second electrode 52 is denoted as p, and the thickness of the piezoelectric layer 4 is denoted as d, the relationship between the fractional bandwidth and d/p thereof has the same tendency as the relationship between the fractional bandwidth and d/p of the structural model 1r of the acoustic wave device.

Furthermore, as is clear from FIG. 10A, in a case of d/p≤about 0.10, when d/p is changed within a range of about 0<d/p≤about 0.10, it is possible to further increase the coupling coefficient and further increase the fractional bandwidth.

FIG. 10B is a graph obtained by enlarging a portion of FIG. 10A. As shown in FIG. 10B, because the fractional bandwidth takes a point at d/p=about 0.096 as an inflection point, in a case of d/p≤about 0.096, by changing d/p within a range of d/p≤about 0.096, it is possible to further increase the coupling coefficient and further increase the fractional bandwidth compared to the case of about 0.96<d/p. Further, as shown in FIG. 10B, the fractional bandwidth changes while taking points at d/p=about 0.072 and about 0.048 as inflection points. Thus, in the case of about 0.048≤d/p≤about 0.072, it is possible to reduce or prevent a change in the coupling coefficient due to a change in d/p, and cause the fractional bandwidth to have a constant or substantially constant value.

Figure 11:
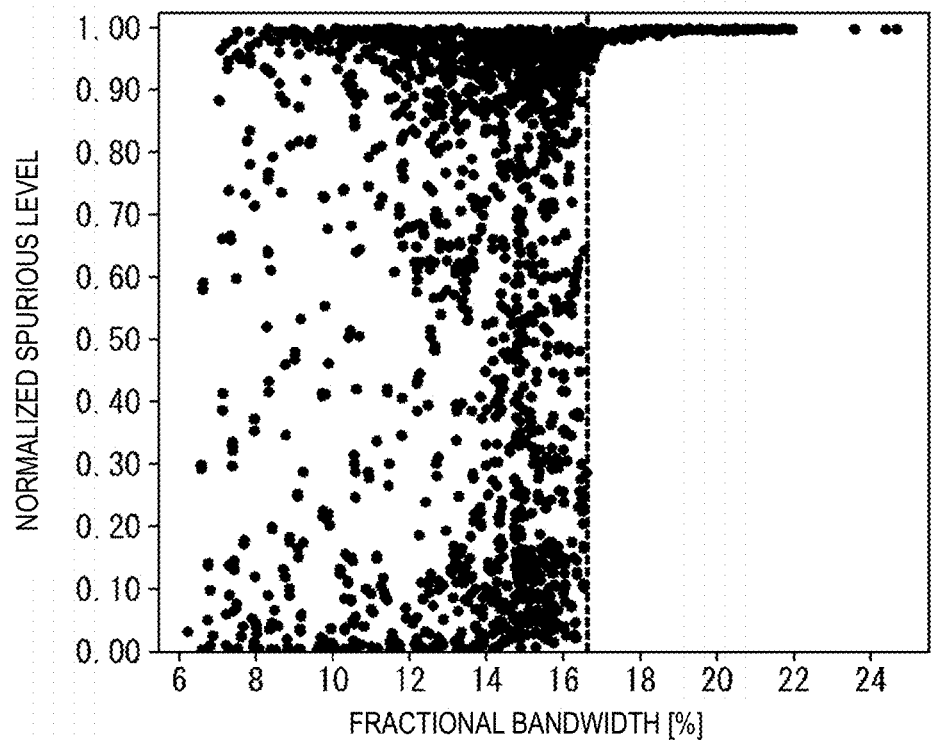
FIG. 11 is a graph showing a relationship between a fractional bandwidth of a thickness slip mode and a normalized spurious level with regard to the acoustic wave device in FIG. 1.

FIG. 11 is a graph plotting spurious levels in a frequency band between a resonant frequency and an anti-resonant frequency in a case where the thickness d of the piezoelectric layers 4, the distance p between the center lines of the first electrode 51 and the second electrode 52, the first electrode width H1, and the second electrode width H2 are changed in the structural model 1r of the acoustic wave device according to the reference configuration utilizing the thickness slip mode. In FIG. 11, the horizontal axis represents the fractional bandwidth and the vertical axis represents the normalized spurious level. The normalized spurious level is a value obtained by normalizing the spurious level in the following manner: a spurious level is considered to be 1 at a fractional bandwidth (for example, about 22%) where the spurious level has the same or substantially the same value even when the thickness d of the piezoelectric layers 4, the distance p between the center lines of the first electrode 51 and the second electrode 52, the first electrode width H1, and the second electrode width H2 are changed. FIG. 11 shows a case where a Z-cut LiNbO$_3$ capable of more suitably exciting the thickness slip mode is used as the piezoelectric layer 4, and the same or substantially the same tendency is obtained in the cases of other cut-angles. In the structural model 1r of the acoustic wave device, even when the material of the piezoelectric layer 4 is LiTaO$_3$, for example, the relationship between the normalized spurious level and the fractional bandwidth has the same or substantially the same tendency as that in FIG. 11. In the structural model 1r of the acoustic wave device, the relationship between the normalized spurious level and the fractional bandwidth has the same or substantially the same tendency as that in FIG. 11, regardless of the number of pairs of the first electrode 51 and the second electrode 52. Further, in the structural model 1r of the acoustic wave device, in addition to the case where the second principal surface 42 of the piezoelectric layer 4 is in contact with air, in a case where the second principal surface 42 thereof is in contact with an acoustic reflection layer, the relationship between the normalized spurious level and the fractional bandwidth has the same or substantially the same tendency as that in FIG. 11.

Figure 12:
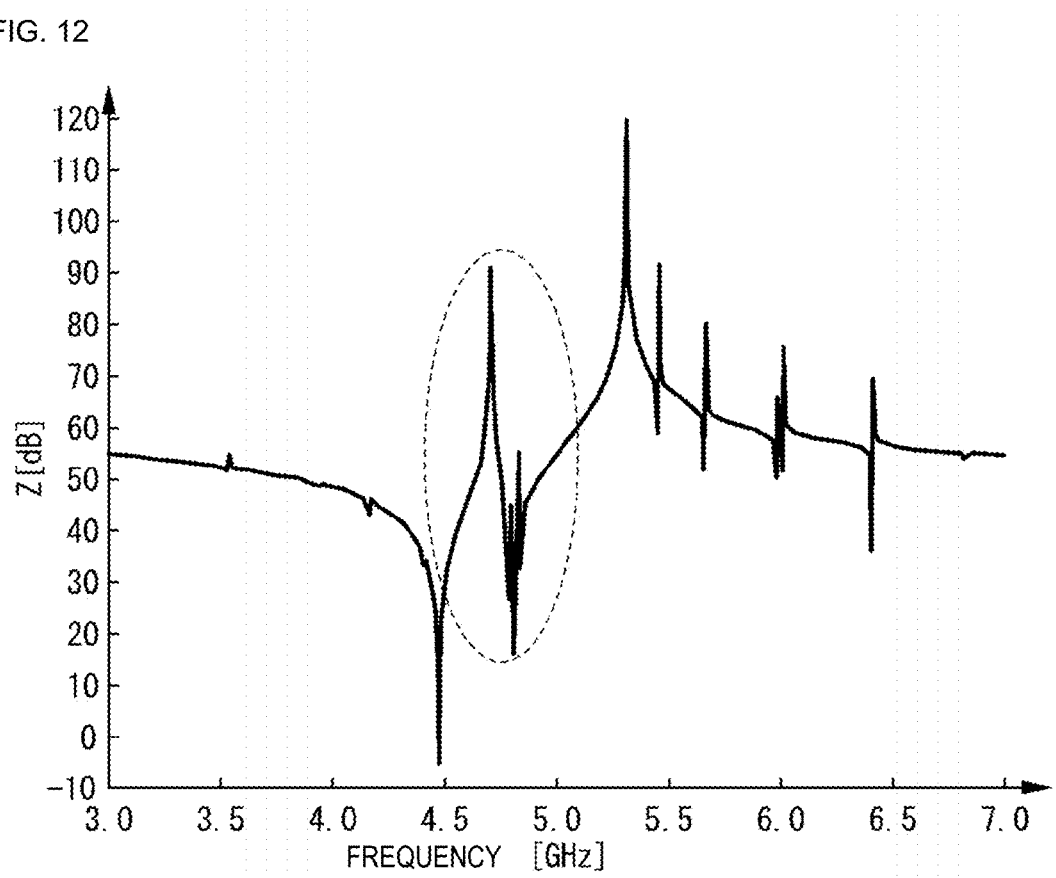
FIG. 12 is a diagram of impedance-frequency characteristics of the acoustic wave device in FIG. 1

It may be understood from FIG. 11 that when the fractional bandwidth exceeds about 17%, the normalized spurious level aggregates to 1. This indicates that, when the fractional bandwidth is about 17% or more, some sub-resonance exists in a band between the resonant frequency and the anti-resonant frequency as in frequency characteristics of impedance exemplified in FIG. 12. FIG. 12 shows frequency characteristics of impedance in a case where a Z-cut LiNbO$_3$ with Euler angles being about (0°, 0°, 90°) is used as the piezoelectric layer 4, d/p equals about 0.08, and MR equals about 0.35. In FIG. 12, a portion of the sub-resonance is surrounded by a broken line.

As described above, in the case where the fractional bandwidth exceeds about 17%, even when the thickness d of the piezoelectric layer 4, the distance p between the center lines of the first electrode 51 and the second electrode 52, the first electrode width H1, and the second electrode width H2 are changed, large spurious signals are included in the band between the resonant frequency and the anti-resonant frequency. Such spurious signals are generated by overtones in a planar direction, mainly in a direction in which the first electrode 51 and the second electrode 52 face each other. Therefore, from the viewpoint of reducing or preventing spurious signals in the band, the fractional bandwidth is preferably not more than about 17%, for example. Each of the resonators 5 of the acoustic wave device 1 according to the present preferred embodiment exhibits the same or similar trend to that of the structural model 1r of the acoustic wave device regarding the relationship between the normalized spurious level and the fractional bandwidth, and therefore it is preferable that the fractional bandwidth is not greater than about 17%, for example.

Figure 13:
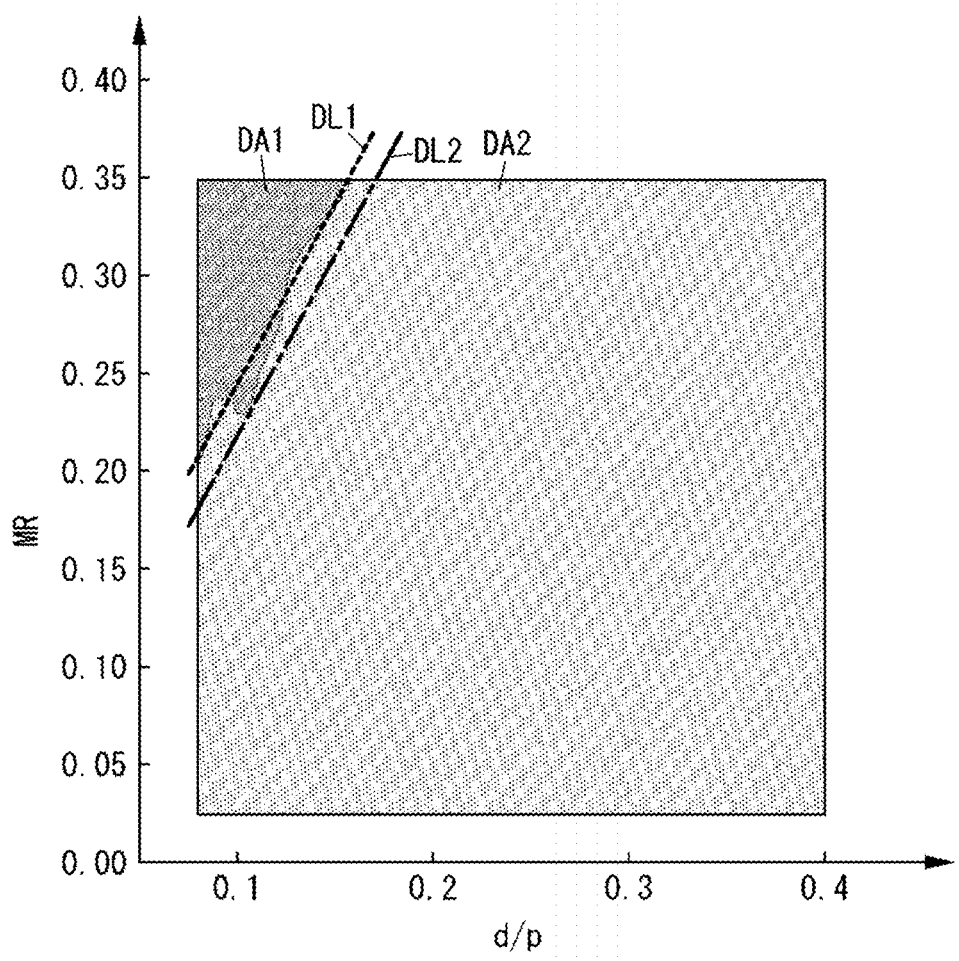
FIG. 13 is a diagram for explaining a fractional bandwidth distribution in a combination of an expression of [the thickness of the piezoelectric layer]/[the distance between the center lines of the first electrode and second electrode] and a structural parameter with regard to the acoustic wave device in FIG. 1.

FIG. 13 shows, with respect to the structural model 1r of the acoustic wave device, a first distribution region DA1 with a fractional bandwidth exceeding about 17% and a second distribution region DA2 with a fractional bandwidth being not more than about 17% while considering d/p and MR as parameters, when a Z-cut LiNbO$_3$ is used as the piezoelectric layer 4, and the thickness d of the piezoelectric layer 4, the distance p between the center lines of the first electrode 51 and the second electrode 52, the first electrode width H1 and the second electrode width H2 are changed. In FIG. 13, the first distribution region DA1 and the second distribution region DA2 have different dot densities, and the dot density of the first distribution region DA1 is higher than the dot density of the second distribution region DA2. In FIG. 13, an approximately straight line DL1 of a boundary line between the first distribution region DA1 and the second distribution region DA2 is indicated by a broken line. The straight or approximately straight line DL1 is represented by a numerical expression of MR=1.75×(d/p)+0.075. Accordingly, in the structural model 1r of the acoustic wave device, by satisfying a condition of MR≤1.75×(d/p)+0.075, the fractional bandwidth may be easily set to be not greater than about 17%. FIG. 13 shows a case where a Z-cut LiNbO$_3$ capable of more suitably exciting the thickness slip mode is used as the piezoelectric layer 4, and the same or substantially the same tendency is obtained in the cases of other cut-angles. In the structural model 1r of the acoustic wave device, even when the material of the piezoelectric layer 4 is LiTaO$_3$, the straight or approximately straight line DL1 is the same or substantially the same as that in the case of LiNbO$_3$. In the structural model 1r of the acoustic wave device, the straight or approximately straight line DL1 is the same regardless of the number of pairs of the first electrode 51 and the second electrode 52. Further, in the structural model 1r of the acoustic wave device, in addition to the case where the second principal surface 42 of the piezoelectric layer 4 is in contact with air, in a case where the second principal surface 42 thereof is in contact with an acoustic reflection layer, the straight or approximately straight line DL1 is the same or substantially the same. In each resonator 5 of the acoustic wave device 1 according to the present preferred embodiment, by satisfying the condition of MR≤1.75×(d/p)+0.075, the fractional bandwidth may be easily set to be not greater than about 17% as in the structural model 1r of the acoustic wave device. In FIG. 13, a straight or approximately straight line DL2 (hereinafter, also referred to as a second approximate straight line DL2) indicated by a chain line separately from the straight or approximately straight line DL1 (hereinafter, also referred to as the first approximate straight line DL1) is a line indicating a boundary for reliably setting the fractional bandwidth to be not greater than about 17%. The second straight or approximately straight line DL2 is represented by a numerical expression of MR=1.75×(d/p)+0.05. Accordingly, in the structural model 1r of the acoustic wave device and the acoustic wave device 1 according to the present preferred embodiment, by satisfying a condition of MR≤1.75×(d/p)+0.05, the fractional bandwidth may be reliably set to be not greater than about 17%.

(5) Advantageous Effects

The acoustic wave device 1 according to the present preferred embodiment includes the plurality of resonators 5. Each of the plurality of resonators 5 includes the first electrodes 51, the second electrodes 52, and the setting portion 400 (401, 402) including the setup region in which the first electrodes 51 and the second electrodes 52 are provided in the piezoelectric layer 4. The acoustic wave device 1 utilizes a bulk wave of the thickness slip first-order mode. The material of the piezoelectric layer 4 is lithium niobate or lithium tantalate, for example. The thickness of each of the plurality of resonators 5 is a thickness excluding the thickness of the first electrode 51 and the second electrode 52 included in the resonator 5. The thickness d1 of a first resonator as one resonator 5 (for example, the series-arm resonator RS1) among the plurality of resonators 5 differs from the thickness of a second resonator as another resonator 5 (for example, the parallel-arm resonator RS2) different from the one resonator 5 among the plurality of resonators 5. The first resonator may be the parallel-arm resonator RS2 and the second resonator may be the series-arm resonator RS1. Alternatively, each of the first resonator and the second resonator may be the series-arm resonator RS1. Alternatively, each of the first resonator and the second resonator may be the parallel-arm resonator RS2.

In the acoustic wave device 1 according to the present preferred embodiment, a bulk wave of the thickness slip first-order mode is utilized, and resonance characteristics are obtained by the wave propagation in the Z direction, such that it is not necessary to provide reflectors. Therefore, propagation loss at the time of propagating to reflectors is not generated. Thus, even when the number of electrode pairs each including the first electrode 51 and the second electrode 52 is reduced in order to reduce the planar size, the Q value is unlikely to be reduced. Accordingly, the Q value may be increased even when the size reduction is achieved.

In the acoustic wave device 1 according to the present preferred embodiment, the thickness d1 of one resonator 5 (for example, the series-arm resonator RS1) among the plurality of resonators 5 differs from the thickness d2 of another resonator 5 (for example, the parallel-arm resonator RS2) different from the one resonator 5 among the plurality of resonators 5. This makes it possible, in the acoustic wave device 1 according to the present preferred embodiment, to cause the resonant frequency of one resonator 5 to differ from the resonant frequency of another resonator 5. The thickness d2 of the parallel-arm resonator R2 may be greater than the thickness d1 of the series-arm resonators RS1.

Figure 14:
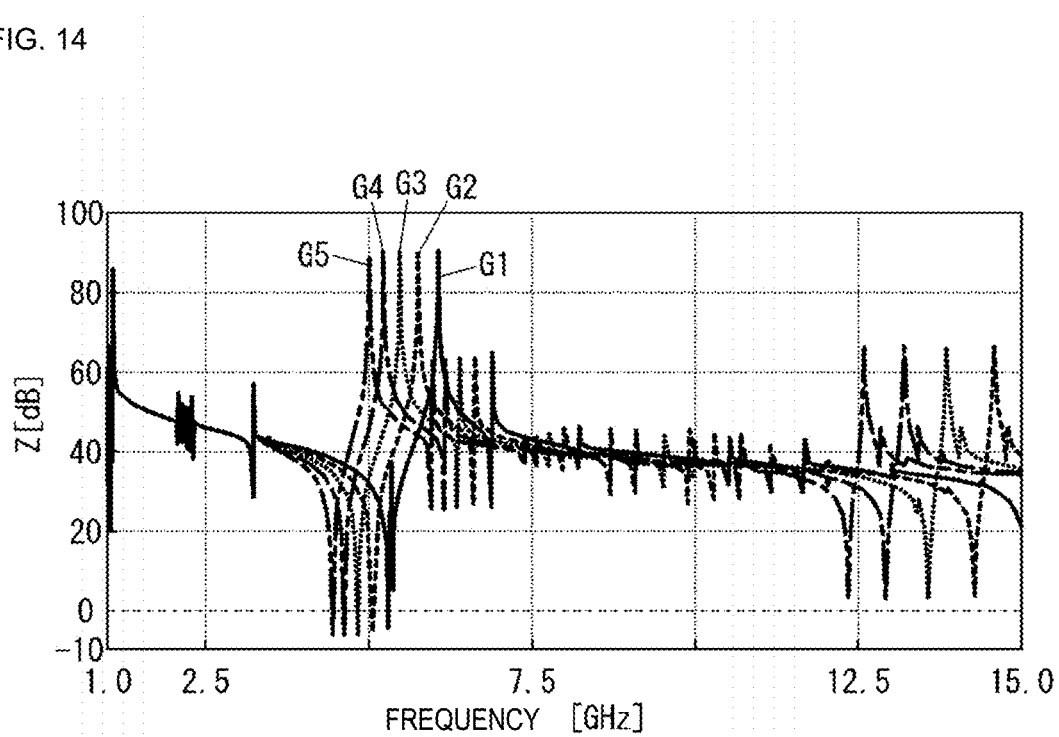
FIG. 14 is a graph showing resonance characteristics of a resonator when a film thickness of a piezoelectric layer 4 is changed.

FIG. 14 is a graph showing resonance characteristics of one resonator 5 among the resonators 5 when a film thickness of the piezoelectric layer 4 is changed in a range from about 0.36 μm to about 0.44 μm, for example. Parameters of the one resonator 5 with the depicted resonance characteristics are set as follows. The piezoelectric layer 4 is made of LiNbO$_3$, and the Euler angles of LiNbO$_3$ are about (0°, 0°, 90°). The number of electrode sets each including the first electrode 51 and the second electrode 52 is 50. The width of the first electrode 51 is about 0.5 μm, and the width of the second electrode 52 is about 0.5 μm. The distance between the center-lines of the first electrode 51 and the second electrode 52 is about 3 μm. The material of the first electrode 51 and the second electrode 52 has a laminated structure including an Al film or a Ti film. The thickness of the Al film is about 100 nm. The distances between the electrodes of the electrode sets each including the first electrode 51 and the second electrode 52 are equal or substantially equal to each other in all of the plurality of pairs. That is, the first electrodes 51 and the second electrodes 52 are provided at an equal or substantially equal pitch.

A line G1 shown in FIG. 14 represents resonance characteristics when the film thickness of the piezoelectric layer 4 is about 0.36 μm. A line G2 represents resonance characteristics when the film thickness of the piezoelectric layer 4 is about 0.38 μm, a line G3 represents resonance characteristics when the film thickness of the piezoelectric layer 4 is about 0.4 μm, a line G4 represents resonance characteristics when the film thickness of the piezoelectric layer 4 is about 0.42 μm, and a line G5 represents resonance characteristics when the film thickness of the piezoelectric layer 4 is about 0.44 μm.

As is clear from FIG. 14, when the film thickness of the piezoelectric layer 4 is changed, both the resonant frequency and the anti-resonant frequency of the main resonance characteristics change. Accordingly, by causing the thickness of one resonator 5 among the plurality of resonators 5 to differ from the thickness of another resonator 5 different from the one resonator 5 among the plurality of resonators 5, the resonant frequency of the one resonator 5 may be made different from the resonant frequency of the another resonator 5.

The acoustic wave device 1 according to the present preferred embodiment is capable of supporting higher frequencies. In this case, in the acoustic wave device 1 according to the present preferred embodiment, the resonant frequency can be increased by reducing the thickness of the piezoelectric layer 4 without being restricted by the distance between the center lines of the first electrode 51 and the second electrode 52, thus making it possible to support higher frequencies without increasing the planar size of the acoustic wave device 1. In the acoustic wave device 1 according to the present preferred embodiment, the thickness d1 of one resonator 5 (for example, the series-arm resonator RS1) among the plurality of resonators 5 differs from the thickness d2 of another resonator 5 (for example, the parallel-arm resonator RS2) different from the one resonator 5 among the plurality of resonators 5. Accordingly, the resonant frequency of the resonator 5 at the above-discussed position (for example, the series-arm resonator RS1) may be made different from the resonant frequency of the another resonator 5 (for example, the parallel-arm resonator RS2). Thus, the frequency of each resonator 5 may be easily adjusted.

The acoustic wave device 1 according to the present preferred embodiment includes the plurality of resonators 5. Each of the plurality of resonators 5 includes the first electrode 51, the second electrode 52, and the setting portion 400 (401, 402) including the setup region in which the first electrode 51 and the second electrode 52 are provided in the piezoelectric layer 4. The acoustic wave device 1 is configured such that, in any cross section along the thickness direction D1 of the piezoelectric layer 4, in the case where the distance between the center line of the first electrode 51 and the center line of the second electrode 52 is denoted as p and the thickness of the piezoelectric layer 4 is denoted as d, d/p is not greater than about 0.5. The material of the piezoelectric layer 4 is lithium niobate or lithium tantalate, for example. The thickness of each of the plurality of resonators 5 is a thickness excluding the thickness of the first electrode 51 and the second electrode 52 included in the resonator 5. The thickness d1 of one resonator 5 (for example, the series-arm resonator RS1) among the plurality of resonators 5 differs from the thickness of another resonator 5 (for example, the parallel-arm resonator RS2) different from the one resonator 5 among the plurality of resonators 5.

The acoustic wave device 1 according to the present preferred embodiment is capable of increasing the Q value and adjusting the resonant frequency even when the miniaturization is achieved.

Further, the acoustic wave device 1 according to the present preferred embodiment includes the cavity 26, so that the energy of the bulk wave is confined in the piezoelectric layer 4 and a favorable Q value may be obtained.

(6) Modifications

The above-described preferred embodiments are merely example preferred embodiments of the present invention. The above-described preferred embodiments may be modified in various ways in accordance with design and the like, as long as the advantageous effects of various preferred embodiments of the present invention can be obtained.

(6.1) Modification 1

Hereinafter, an acoustic wave device 1a according to Modification 1 of a preferred embodiment of the present invention will be described with reference to FIG. 15A. As for the acoustic wave device 1a according to Modification 1, the same or corresponding elements as those of the acoustic wave device 1 according to the present preferred embodiment are denoted by the same reference signs, and description thereof will be omitted.

The acoustic wave device 1a according to Modification 1 differs from the acoustic wave device 1 according to the above-described preferred embodiment in that a dielectric film 9 is further provided.

The dielectric film 9 is in contact with the first principal surface 41 of the piezoelectric layer 4 to cover the first principal surface 41 of the piezoelectric layer 4 and each of the electrode portions 50 on the first principal surface 41. The dielectric film 9 includes a first surface 91 and a second surface 92 facing each other. The first surface 91 and the second surface 92 face each other in the thickness direction D1 of the piezoelectric layer 4. In the dielectric film 9, the second surface 92 of the first surface 91 and the second surface 92 is located on the piezoelectric layer 4 side.

The resonator 5 of the present modification includes the electrode portion 50 including the first electrode 51 and the second electrode 52, the setting portion 400 (hereinafter referred to as the first setting portion 400) including a setup region where the electrode portion 50 is provided in the piezoelectric layer 4, and a second setting portion 900 including a region in contact with the setup region in the dielectric film 9.

In the present modification, similar to the above-described preferred embodiment, a thickness d10 of one resonator 5 (for example, the series-arm resonator RS1) among the plurality of resonators 5 differs from a thickness d20 of another resonator 5 (for example, the parallel-arm resonator RS2) different from the one resonator 5 among the plurality of resonators 5. In this case, the thickness of each of the plurality of resonators 5 is a thickness excluding the thickness of the first electrode 51 and the second electrode 52 included in the resonator 5, and is also the sum of the thickness of the piezoelectric layer 4 in the setting portion 400 and the thickness of the dielectric film 9 included in the resonator 5. In this case, the thickness of the dielectric film 9 is a thickness from the second surface 92 to the first surface 91.

In the present modification, the thickness at each setting portion 400, that is, the thickness of the piezoelectric layer 4 is the same or substantially the same. Within the dielectric film 9, for example, a thickness d11 of the dielectric film 9 in a region where the resonator 5 as the series-arm resonator RS1 is provided differs from a thickness d21 of the dielectric film 9 in a region where the resonator 5 as the parallel-arm resonator RS2 is provided. In other words, the thickness d11 of a second setting portion 901 of the series-arm resonator RS1 is different from the thickness d21 of a second setting portion 902 of the parallel-arm resonator RS2. In the present modification, the thickness d11 of the second setting portion 901 is larger than the thickness d21 of the second setting portion 902. Accordingly, the sum of the thickness of the piezoelectric layer 4 in the region where the series-arm resonator RS1 is provided (the thickness of the setting portion 401) and the thickness d11 of the dielectric film 9 (the thickness of the second setting portion 901) is larger than the sum of the thickness of the piezoelectric layer 4 in the region where the parallel-arm resonator RS2 is provided (the thickness of the setting portion 402) and the thickness d21 of the dielectric film 9 (the thickness of the second setting portion 902). In other words, the thickness d10 of the series-arm resonator RS1 is larger than the thickness d20 of the parallel-arm resonator RS2. The thickness d21 of the second setting portion 902 may be larger than the thickness d11 of the second setting portion 901.

It is not necessary for each of the setting portions 400 to have the same or substantially the same thickness. It preferable the thickness of one resonator 5 differs from the thickness of another resonator 5. For example, the thickness of the dielectric film 9 of one resonator 5 may be the same or substantially the same as that of another resonator 5, and the thicknesses of the setting portions 400 may be different from each other. Alternatively, the thicknesses of both the dielectric film and the piezoelectric layer 4 may be different between one resonator 5 and another resonator 5.

In the present modification, the acoustic wave device 1a is capable of increasing the Q value and adjusting the resonant frequency even when the miniaturization is achieved.

Figures 15A, 15B:
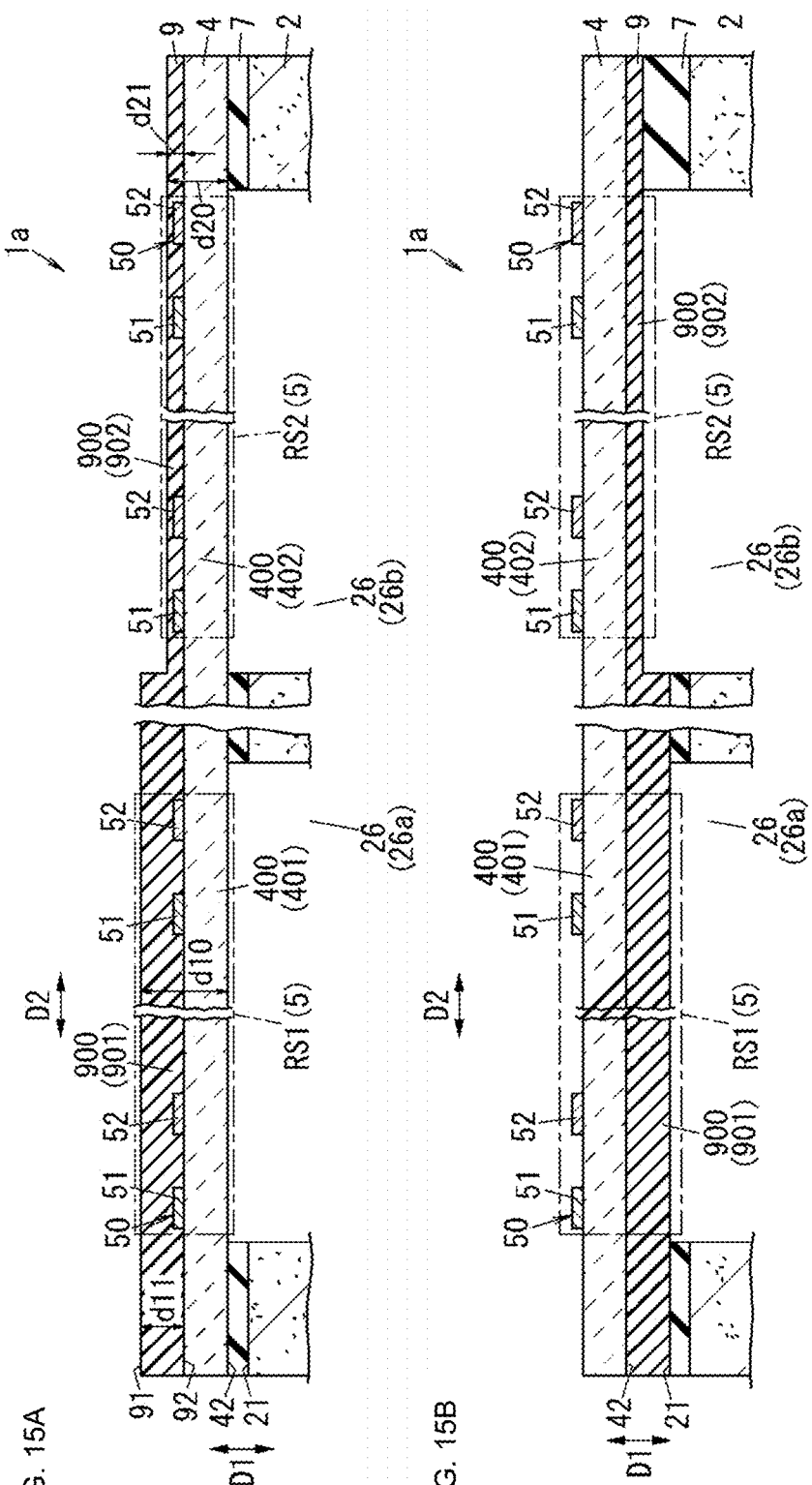
FIG. 15A is a cross-sectional view of an acoustic wave device according to Modification 1 of a preferred embodiment of the present invention.
FIG. 15B is a cross-sectional view of an acoustic wave device according to another modification of Modification 1 of a preferred embodiment of the present invention.

In FIG. 15A, the dielectric film 9 is in contact with the first principal surface 41 of the piezoelectric layer 4, but is not limited thereto. As illustrated FIG. 15B, the dielectric film 9 may be in contact with the second principal surface 42 of the piezoelectric layer 4. In this case as well, the thickness of the dielectric film 9 in the series-arm resonator RS1 is made different from the thickness of the dielectric film 9 in the parallel-arm resonator RS2. For example, the dielectric film 9 in the series-arm resonator RS1 is thicker than the dielectric film 9 in the parallel-arm resonator RS2. The dielectric film 9 in the parallel-arm resonator RS2 may be thicker than the dielectric film 9 in the series-arm resonator RS1.

Further, in FIG. 15A, the first surface 91, which is a front surface of the dielectric film 9, is flattened to have a planar shape. However, the shapes of the front surface of the dielectric film 9 are not limited to the shapes illustrated in FIGS. 15A and 15B.

Figure 16A:
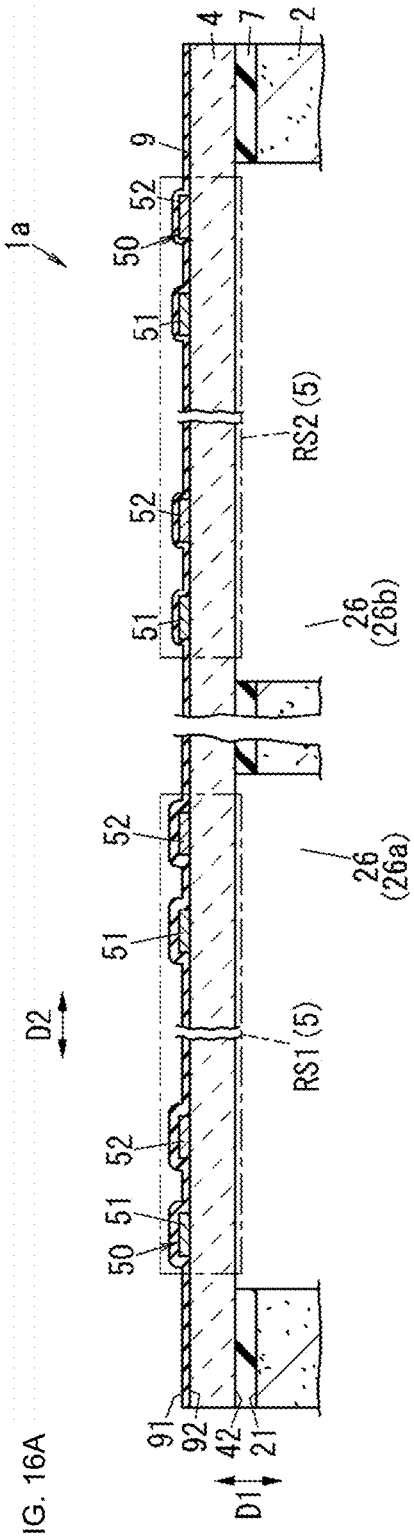
FIGS. 16A and 16B are cross-sectional views of an acoustic wave device according to another modification of Modification 1 of a preferred embodiment of the present invention.

For example, as illustrated in FIG. 16A, the dielectric film 9 may be thinner than the first electrode 51 and the second electrode 52, and the front surface of the dielectric film 9 may have an uneven shape along the shape of the base material. At this time, the thickness of the dielectric film 9 in the series-arm resonator RS1 is larger than the thickness of the dielectric film 9 in the parallel-arm resonator RS2.

Figure 16B:
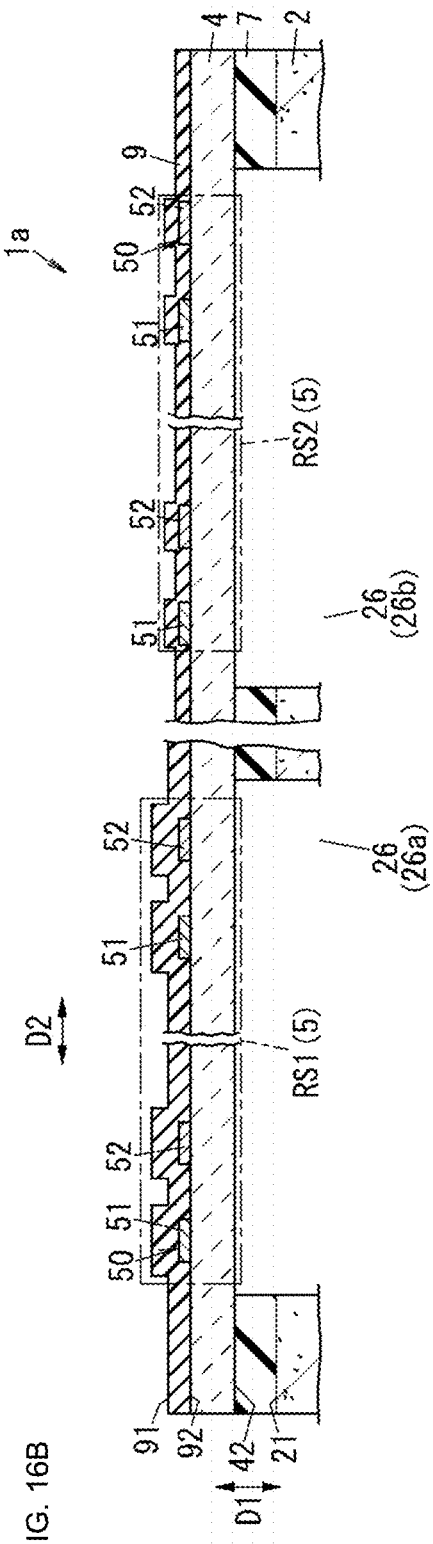

For example, as illustrated in FIG. 16B, the dielectric film 9 may be thicker than the first electrode 51 and the second electrode 52, and the front surface of the dielectric film 9 may have an uneven shape along the shape of the base material. At this time, the thickness of the dielectric film 9 in the series-arm resonator RS1 is larger than the thickness of the dielectric film 9 in the parallel-arm resonator RS2. In this case, the thickness of the dielectric film 9 refers to the thickness of the dielectric film 9 at the location where the dielectric film 9 does not overlap with the first electrode 51 and second electrode 52 in a plan view.

The present modification includes the dielectric film 9 for each resonator 5, but is not limited to this configuration. The plurality of resonators 5 may include the resonator 5 including no dielectric film 9. In other words, at least one of the plurality of resonators 5 may include the dielectric film 9. In this case, the thickness d1 of the resonator 5 including the dielectric film 9 is the sum of the thickness of the piezoelectric layer 4 at the setting portion 400 included in the resonator 5 and the thickness of the dielectric film 9 touching at the setting portion 400. The thickness d2 of the resonator 5 not including the dielectric film 9 is the thickness of the piezoelectric layer 4 at the setting portion 400 included in the resonator 5.

(6.2) Modification 2

In the above-described preferred embodiment, in order to make the thickness of the piezoelectric layer 4 in the series-arm resonator RS1 and the thickness of the piezoelectric layer 4 in the parallel-arm resonator RS2 different from each other, etching is performed on the second principal surface 42 of the piezoelectric layer 4, but the preferred embodiment is not limited thereto.

Figure 17:
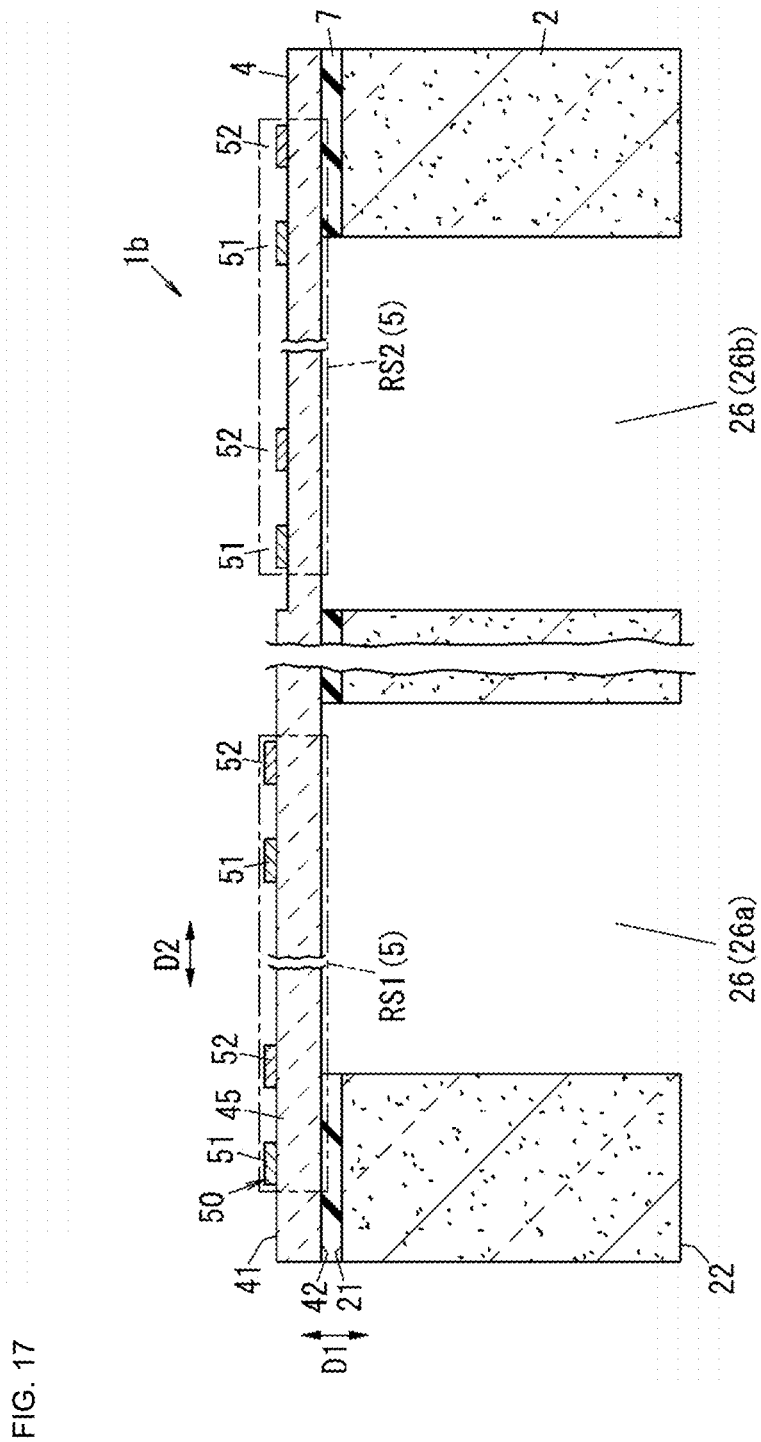
FIG. 17 is a cross-sectional view of an acoustic wave device according to Modification 2 of a preferred embodiment of the present invention.

In an acoustic wave device 1b of Modification 2 of a preferred embodiment of the present invention, in order to make the thickness of the piezoelectric layer 4 in the series-arm resonator RS1 and the thickness of the piezoelectric layer 4 in the parallel-arm resonator RS2 different from each other, etching may be performed on the first principal surface 41 of the piezoelectric layer 4 to provide a difference in level on the first principal surface 41 of the piezoelectric layer 4 (see FIG. 17).

(6.3) Modification 3

Figure 18:
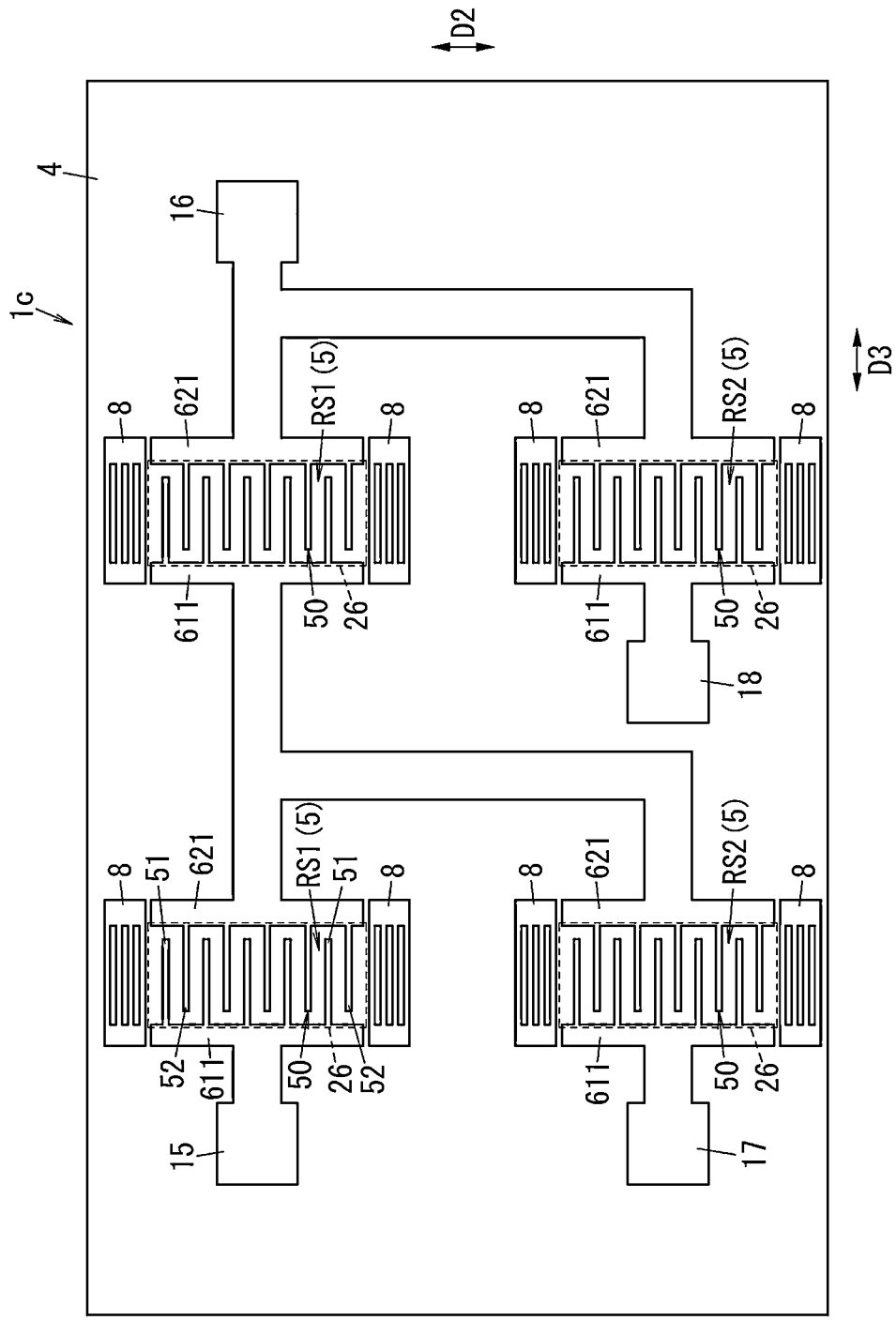
FIG. 18 is a plan view of an acoustic wave device according to Modification 3 of a preferred embodiment of the present invention.

Hereinafter, an acoustic wave device 1c according to Modification 3 of a preferred embodiment of the present invention will be described with reference to FIG. 18. As for the acoustic wave device 1c according to Modification 3, the same or corresponding elements as those of the acoustic wave device 1 according to the above-discussed preferred embodiment are denoted by the same reference signs, and description thereof will be omitted.

The acoustic wave device 1c according to Modification 3 differs from the acoustic wave device 1 according to the above-described preferred embodiment in that a pair of reflectors 8 are further provided for each electrode portion 50.

Each reflector 8 is a short-circuit grating. Each reflector 8 not only reflects a bulk wave of a first-order slip mode, but also reflects an unwanted surface acoustic wave propagating along the first principal surface 41 of the piezoelectric layer 4. One reflector 8 of the pair of reflectors 8 is located on the opposite side to the second electrode 52 side of the first electrode 51 located at the end of the plurality of first electrodes 51 in a direction along a propagation direction of the unwanted surface acoustic wave of the acoustic wave device 1c. The remaining one reflector 8 of the pair of reflectors 8 is located on the opposite side to the first electrode 51 side of the second electrode 52 located at the end of the plurality of second electrodes 52 in the direction along the propagation direction of the unwanted surface acoustic wave of the acoustic wave device 1c.

Each reflector 8 includes a plurality of (for example, four) electrode fingers, and one end of each of the plurality of electrode fingers 81 is short-circuited to each other, and the other end thereof is short-circuited to each other. In each reflector 8, the number of electrode fingers 81 is not particularly limited.

Each reflector 8 is electrically conductive. The material of each reflector 8 is, for example, Al, Cu, Pt, Au, Ag, Ti, Ni, Cr, Mo, W, or an alloy including any of these metals as a main ingredient. Each reflector 8 may have a structure in which a plurality of metal films made of these metals or alloys are laminated. Each reflector 8 includes, for example, a laminated film including a close contact film made of a Ti film provided on the piezoelectric layer 4, and a main electrode film made of an Al film provided on the close contact film. The close contact film has a thickness of, for example, about 10 nm. The main electrode film has a thickness of, for example, about 80 nm.

In the acoustic wave device 1c according to Modification 3, each reflector 8 is a short-circuit grating. However, the reflector 8 is not limited thereto, and may be, for example, an open grating, a positive-negative reflection grating, or a grating in which a short-circuit grating and an open grating are combined. Further, in the acoustic wave device 1c, two (paired) reflectors 8 are provided for each electrode portion 50. However, only one of the two reflectors 8 may be provided.

(6.4) Modification 4

Hereinafter, an acoustic wave device 1d according to Modification 4 of a preferred embodiment of the present invention will be described with reference to FIG. 19. As for the acoustic wave device 1d according to Modification 4, the same or corresponding elements as those of the acoustic wave device 1 according to the above-discussed preferred embodiment are denoted by the same reference signs, and description thereof will be omitted.

The acoustic wave device 1d according to Modification 4 differs from the acoustic wave device 1 according to the above-described preferred embodiment in that an acoustic reflection layer 3 is provided.

Figure 19:
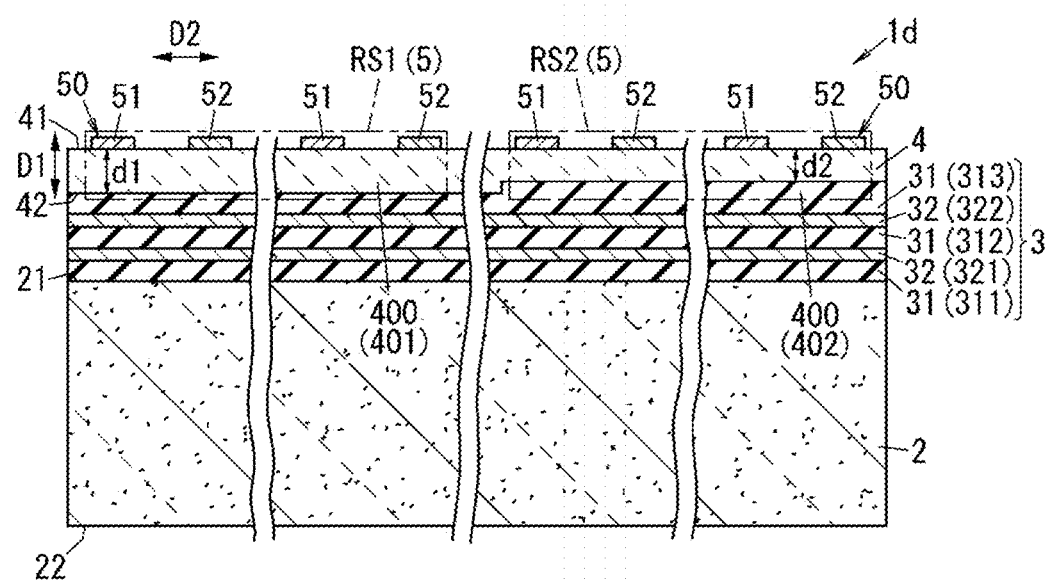
FIG. 19 is a cross-sectional view of an acoustic wave device according to Modification 4 of a preferred embodiment of the present invention.

As illustrated in FIG. 19, the acoustic wave device 1d according to Modification 4 includes the support substrate 2, the acoustic reflection layer 3, the piezoelectric layer 4, and the plurality of electrode portions 50. Each of the plurality of electrode portions 50 includes the first electrode 51 and the second electrode 52. The acoustic reflection layer 3 is provided on the support substrate 2. The piezoelectric layer 4 is provided on the acoustic reflection layer 3. The plurality of electrode portions 50 is in contact with the piezoelectric layer 4. The acoustic reflection layer 3 includes at least one (for example, two) high acoustic impedance layer 32 and at least one (for example, three) low acoustic impedance layer 31. The low acoustic impedance layer 31 has a lower acoustic impedance than the high acoustic impedance layer 32. The acoustic wave device 1 includes, as the resonator 5, the electrode portion 50 including the first electrodes 51 and the second electrodes 52, and the first setting portion as the setting portion 400 including the setup region where the electrode portion 50 is provided in the piezoelectric layer 4. In the acoustic wave device 1d, the resonator 5 further includes a second setting portion, which is a region overlapping the corresponding setting portion 400 when viewed in the first direction D1 in the acoustic reflection layer 3.

The acoustic wave device 1d is an acoustic wave filter (in this case, for example, a ladder filter), similar to the acoustic wave device 1 according to the above-described preferred embodiment, including the input terminal 15, the output terminal 16, the plurality of (for example, two) series-arm resonators RS1, and the plurality of (for example, two) parallel-arm resonators RS2.

In the acoustic wave device 1d, each of the pluralities of series-arm resonators RS1 and parallel-arm resonators RS2 is the resonator 5. Each of the plurality of resonators 5 includes the first electrode 51 and the second electrode 52. The resonant frequency of the parallel-arm resonator RS2 is higher than that of the series-arm resonators RS1.

As illustrated in FIG. 19, the acoustic reflection layer 3 is provided on the first principal surface 21 of the support substrate 2. The acoustic reflection layer 3 faces the first electrode 51 and the second electrode 52 included in each of the plurality of electrode portions 50 in the thickness direction D1 of the piezoelectric layer 4.

In each of the plurality of electrode portions 50, the acoustic reflection layer 3 reduces or prevents leakage of the bulk waves (bulk waves of the thickness slip first-order mode) excited by the first electrode 51 and the second electrode 52 included in the electrode portion 50 into the support substrate 2. By including the acoustic reflection layer 3, the acoustic wave device 1d may improve the effect of confining the acoustic wave energy in the piezoelectric layer 4. Therefore, the acoustic wave device 1d may reduce the loss and increase the Q value as compared with the case where the acoustic reflection layer 3 is not provided.

The acoustic reflection layer 3 includes a plurality of (for example, three) low acoustic impedance layers 31 and a plurality of (for example, two) high acoustic impedance layers 32 that are laminated and alternately provided one layer by one layer in the thickness direction D1 of the piezoelectric layer 4. The acoustic impedance of the low acoustic impedance layer 31 is lower than the acoustic impedance of the high acoustic impedance layer 32.

Hereinafter, for convenience of description, in the acoustic reflection layer 3, the two high acoustic impedance layers 32 may be referred to as a first high acoustic impedance layer 321 and a second high acoustic impedance layer 322 in the order of closeness to the first principal surface 21 of the support substrate 2. Further, the three low acoustic impedance layers 31 may be referred to as a first low acoustic impedance layer 311, a second low acoustic impedance layer 312, and a third low acoustic impedance layer 313 in the order of closeness to the first principal surface 21 of the support substrate 2.

In the acoustic reflection layer 3, the first low acoustic impedance layer 311, the first high acoustic impedance layer 321, the second low acoustic impedance layer 312, the second high acoustic impedance layer 322, and the third low acoustic impedance layer 313 are provided in this order from the support substrate 2 side. Accordingly, the acoustic reflection layer 3 may reflect the bulk wave (the bulk wave of the thickness slip first-order mode) from the piezoelectric layer 4 at an interface between the third low acoustic impedance layer 313 and the second high acoustic impedance layer 322, an interface between the second high acoustic impedance layer 322 and the second low acoustic impedance layer 312, an interface between the second low acoustic impedance layer 312 and the first high acoustic impedance layer 321, and an interface between the first high acoustic impedance layer 321 and the first low acoustic impedance layer 311.

The material of the plurality of high acoustic impedance layers 32 is, for example, platinum (Pt). The material of the plurality of low acoustic impedance layers 31 is, for example, silicon oxide. The thickness of each of the plurality of high acoustic impedance layers 32 is, for example, about 94 nm. The thickness of each of the plurality of low acoustic impedance layers 31 is, for example, about 188 nm. The acoustic reflection layer includes two conductive layers because each of the two high acoustic impedance layers 32 is, for example, Pt.

The material of the plurality of high acoustic impedance layers 32 is not limited to Pt, and may be a metal such as, for example, tungsten (W) or tantalum (Ta). The material of the plurality of high acoustic impedance layers 32 is not limited to a metal, and may be, for example, an insulator.

The materials of the plurality of high acoustic impedance layers 32 are not limited to the same material, and may be materials different from each other, for example. The materials of the plurality of low acoustic impedance layers 31 are not limited to the same material, and may be materials different from each other, for example.

The number of high acoustic impedance layers 32 in the acoustic reflection layer 3 is not limited to two, and may be one or three or more. The number of low acoustic impedance layers 31 in the acoustic reflection layer 3 is not limited to three, and may be one, two, or four or more. The number of high acoustic impedance layers 32 and the number of low acoustic impedance layers 31 are not limited to being different, and may be the same, or the number of low acoustic impedance layers 31 may be less than the number of high acoustic impedance layers 32 by one. The thickness of each of the high acoustic impedance layer 32 and the low acoustic impedance layer 31 is appropriately set to obtain a favorable reflection in the acoustic reflection layer 3 in accordance with a desired frequency of the acoustic wave device 1 and a material applied to each of the high acoustic impedance layer 32 and the low acoustic impedance layer 31.

In the piezoelectric layer 4 of the present modification, similar to the piezoelectric layer 4 of the above-described preferred embodiment, in the piezoelectric layer 4 of the present modification, the thickness d1 of the piezoelectric layer 4 in the region where the resonator 5 as the series-arm resonator RS1 is provided differs from the thicknesses d2 of the piezoelectric layer 4 in the region where the resonator 5 as the parallel-arm resonator RS2 is provided, for example. That is, the thickness d1 of the setting portion 401 of the series-arm resonator RS1 is different from the thickness d2 of the setting portion 402 of the parallel-arm resonator RS2. In the present modification, as in the above-described preferred embodiment, the thickness d1 of the setting portion 401 is larger than the thickness d2 of the setting portion 402. In the present modification, a difference in level is provided on the second principal surface 42 such that the thickness d1 of the setting portion 401 is larger than the thickness d2 of the setting portion 402. The thickness d2 of the setting portion 402 may be larger than the thickness d1 of the setting portion 401.

In a non-limiting example of a manufacturing method for the acoustic wave device 1d, for example, after the support substrate 2 is prepared, first to fourth steps are performed. In the first step, the acoustic reflection layer 3 is formed on the first principal surface 21 of the support substrate 2. In the second step, a piezoelectric substrate from which the piezoelectric layer 4 is formed and the support substrate 2 are bonded to each other with the acoustic reflection layer 3 interposed therebetween. In the third step, the piezoelectric substrate is thinned to have a predetermined thickness of the piezoelectric layer 4. In the fourth step, the first electrodes 51, the second electrodes 52, the first wiring portion 61, and the second wiring portion 62 are formed on the piezoelectric layer 4. A difference in level is provided on the second principal surface 42 such that the thickness d1 of the setting portion 401 is larger than the thickness d2 of the setting portion 402 in the piezoelectric substrate from which the piezoelectric layer 4 is formed. In the third low acoustic impedance layer 313, a difference in level is provided such that the thickness in a region facing the setting portion 401 is smaller than the thickness in a region facing the setting portion 402. In this case, a difference between the thicknesses of the region facing the setting portion 401 and the region facing the setting portion 402 is the same or substantially the same as the difference between the thicknesses d1 and d2. In the fourth step, the first electrodes 51, the second electrodes 52, the first wiring portion 61, and the second wiring portion 62 are formed using, for example, a photolithography technique, an etching technique, a thin film forming technique, and the like. In the first step to the fourth step, a silicon wafer is used as the support substrate 2, and a piezoelectric wafer is used as the piezoelectric substrate. In the manufacturing method for the acoustic wave device 1, a wafer including the plurality of acoustic wave devices 1 is cut with, for example, a dicing machine to obtain the plurality of acoustic wave devices 1 (chips).

The manufacturing method for the acoustic wave device 1d is merely an example, and is not particularly limited. For example, the piezoelectric layer 4 may be formed using a film-forming technique. In this case, the manufacturing method for the acoustic wave device 1 includes a step of film-forming the piezoelectric layer 4, instead of the second step and the third step. The piezoelectric layer 4 film-formed by the film-forming technique may be, for example, a single crystal or twin crystal. Examples of the film-forming technique include, but are not limited to, a CVD method.

In the present modification, a difference in level may be provided on the first principal surface 41 to provide a thickness for each resonator 5. In this case, in the above-described fourth step, a difference in level is provided on the first principal surface 41 such that the thickness d1 of the setting portion 401 is larger than the thickness d2 of the setting portion 402 in the piezoelectric substrate from which the piezoelectric layer 4 is formed.

The acoustic wave device 1d according to Modification 4, similar to the acoustic wave device 1 according to the above-described preferred embodiment, utilizes a bulk wave of the thickness slip first-order mode. Thus, the acoustic wave device 1d according to Modification 4 is capable of increasing the Q value and adjusting the resonant frequency even when the miniaturization is achieved.

In the acoustic wave device 1d according to Modification 4, the second principal surface 42 of the piezoelectric layer 4 in each resonator 5 can reduce or prevent an unwanted wave by the acoustic reflection layer 3. In the acoustic wave device 1d according to Modification 4, the material of the piezoelectric layer 4 is, for example, $LiNbO_3$ or $LiTaO_3$, and the material of the low acoustic impedance layer 31 is, for example, silicon oxide. The frequency-temperature characteristics of each of $LiNbO_3$ and $LiTaO_3$ has a negative slope, and the frequency-temperature characteristics of silicon oxide has a positive slope. Therefore, in the acoustic wave device 1d according to Modification 4, the absolute value of the temperature coefficient of frequency (TCF) may be made small, and the frequency-temperature characteristics may be improved.

Figure 20:
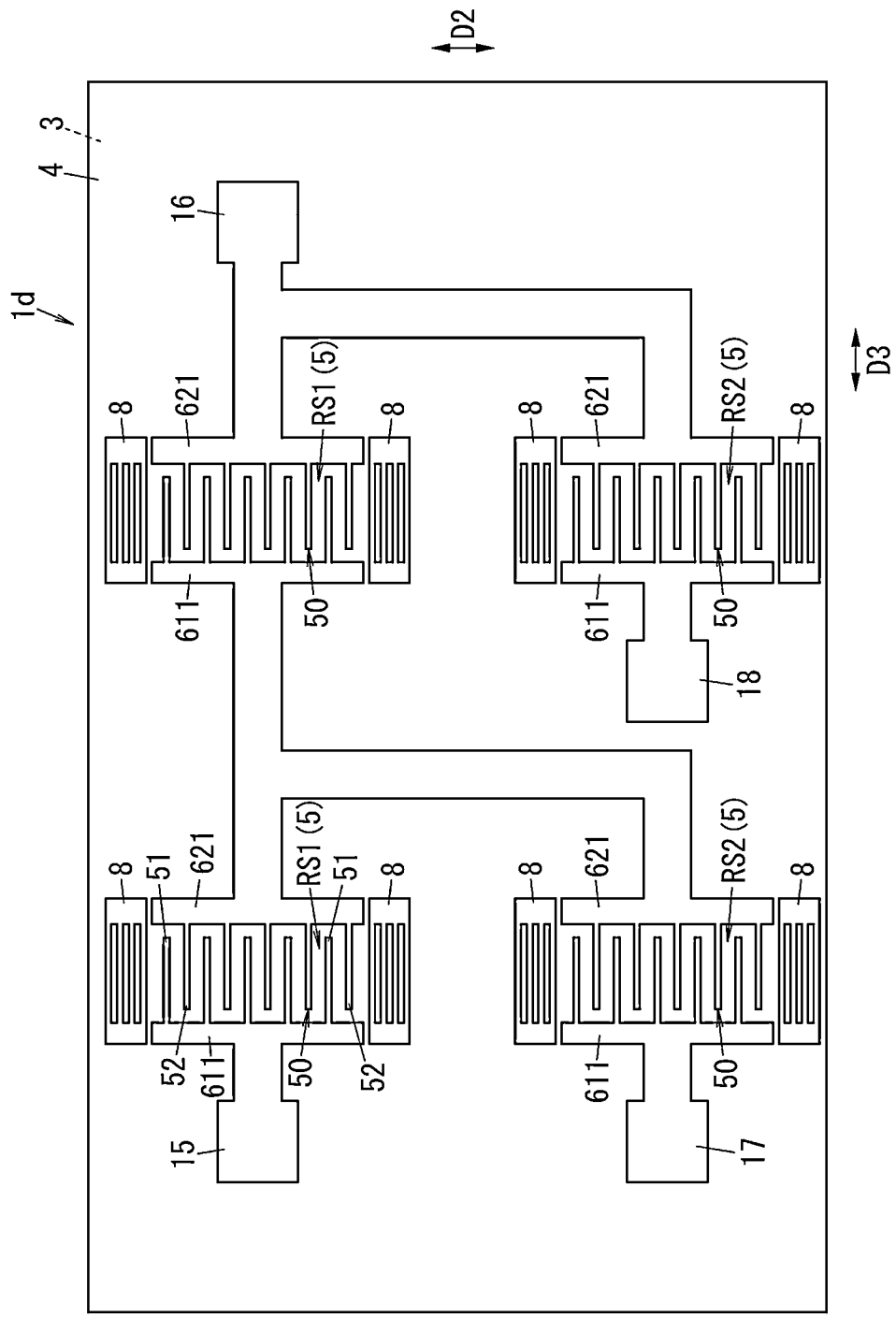
FIG. 20 is a plan view of an acoustic wave device according to another modification of Modification 4 of a preferred embodiment of the present invention.

In the present modification, the acoustic wave device 1d may further include a pair of reflectors 8 for each electrode portion 50 (see FIG. 20). The configuration of each of the reflectors 8 is the same as or similar to that of each of the reflectors 8 of the acoustic wave device 1c.

(6.5) Modification 5

In the acoustic wave device 1 according to the above-described preferred embodiment, the cross section of each of the first electrode 51 and the second electrode 52 has a rectangular or substantially rectangular shape, but is not limited thereto. For example, the first electrode 51 and the second electrode 52 may have a shape such that the width of a lower end is wider than the width of an upper end, as in any of FIGS. 21A to 21D. This makes it possible to increase capacitance between the first electrode 51 and the second electrode 52 without increasing the width of an upper surface of each of the first electrode 51 and the second electrode 52.

Figure 21A:
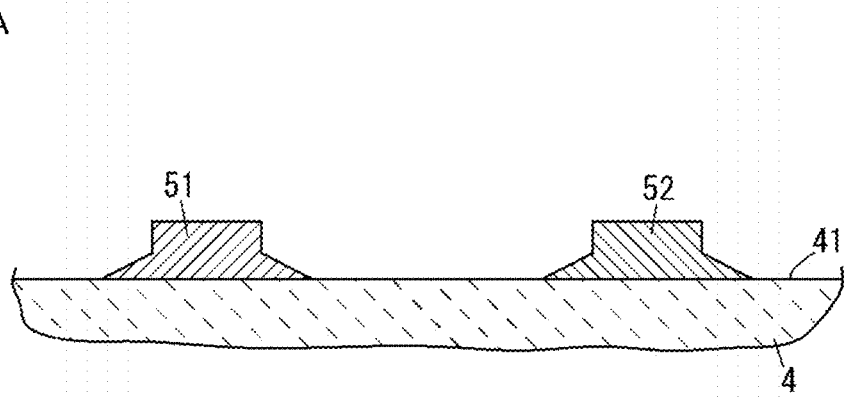
FIGS. 21A to 21D are cross-sectional views illustrating other shapes of a first electrode and a second electrode of an acoustic wave device according to a preferred embodiment of the present invention.
Figure 21B:
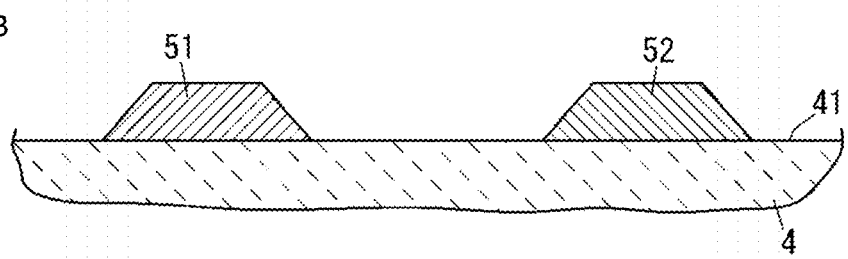
Figure 21C:
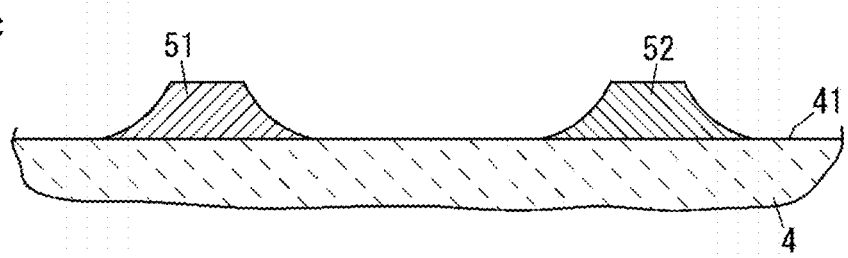
Figure 21D:
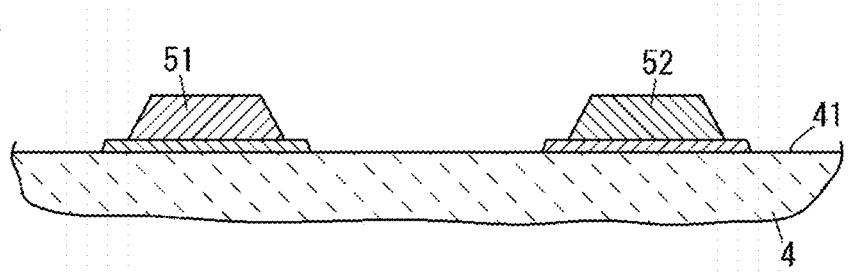
Figure 22:
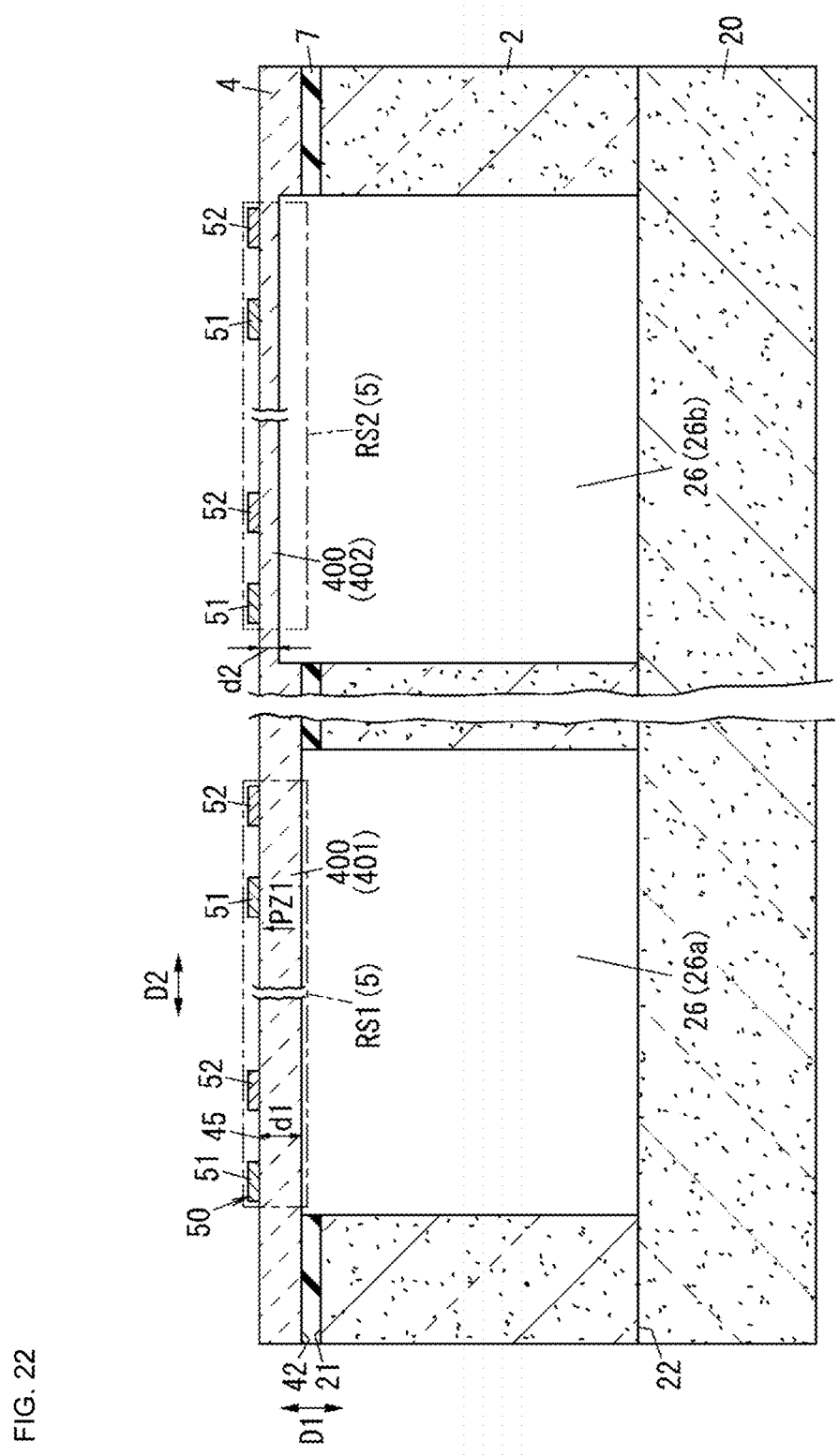
FIG. 22 is a cross-sectional view of an acoustic wave device according to Modification 6 of a preferred embodiment of the present invention.

The first electrode 51 and the second electrode 52 illustrated in FIG. 21A include a portion on the upper end side where the width is constant or substantially constant and a portion on the lower end side where the width is gradually increased. The first electrode 51 and the second electrode 52 illustrated in FIG. 21B have a trapezoidal or substantially trapezoidal cross-sectional shape. The first electrode 51 and the second electrode 52 illustrated in FIG. 21C have a shape widening toward the lower end with curved side surfaces on both sides in the width direction. The first electrode 51 and the second electrode 52 illustrated in FIG. 21D each include a portion with a trapezoidal or substantially trapezoidal cross-sectional shape on the upper end side, and on the lower end side thereof, include a portion with a trapezoidal or substantially trapezoidal cross-sectional shape wider than the portion with the trapezoidal or substantially trapezoidal cross-sectional shape on the upper end side.

(6.6) Modification 6

In the acoustic wave device 1 according to the preferred embodiment described above, for example, as illustrated in FIG. 22, on the opposite side of the support substrate 2 to the piezoelectric layer 4, that is, on the second principal surface 22 of the support substrate 2, an additional substrate 20 may be laminated to overlap the piezoelectric layer 4 in a plan view from the thickness direction D1 of the piezoelectric layer 4. The additional substrate 20 may be made of silicon, for example. In short, in the acoustic wave device 1, a second support substrate defined by the above additional substrate 20 may be bonded to the second principal surface 22 of a first support substrate 2, which is the support substrate 2. The support substrate 2 and the additional substrate 20 are not limited to being laminated, and may be integrally provided as a single substrate.

(6.7) Modification 7

In the above preferred embodiment, an inductor or a capacitor may be included in series with at least one resonator 5 among the plurality of resonators 5. For example, the resonant frequency may be lowered by including an inductor in series with at least one resonator 5 among the plurality of resonators 5. By including a capacitor in series with at least one resonator 5 among the plurality of resonators 5, the resonant frequency may be increased.

Alternatively, an inductor or a capacitor may be included in parallel with at least one resonator 5 among the plurality of resonators 5. For example, the anti-resonant frequency may be increased by including an inductor in parallel with at least one resonator 5 among the plurality of resonators 5. By including a capacitor in parallel with at least one resonator 5 among the plurality of resonators 5, the anti-resonant frequency may be lowered.

In this case, the inductor may be a simple wiring line or may be provided by patterning a wiring line. Alternatively, the inductor may be a mounted component.

Similarly, the capacitor may be provided by capacitance between wiring lines or may be provided by patterning. Alternatively, the capacitor may be a mounted component.

The acoustic wave device 1 is capable of adjusting each resonator 5 to have any desired resonant frequency.

(6.8) Modification 8

In the acoustic wave device 1 according to the above-described preferred embodiment, the series-arm resonator RS1 and the parallel-arm resonator RS2 have different thicknesses from each other, but are not limited to this configuration. The thickness of each series-arm resonator RS1 may be changed, and the thickness of each parallel-arm resonator RS2 may be changed.

In a case where the series-arm resonator RS1 includes a plurality of division-resonators connected in series, one split-resonator of the plurality of split-resonators may have a different thickness from another split-resonator different from the one split-resonator of the plurality of split-resonators. At this time, the thickness of the piezoelectric layer 4 may be made different, or the thickness of the dielectric film 9 may be made different.

In a case where the series-arm resonator RS1 includes a plurality of split-resonators connected in parallel, one split-resonator of the plurality of split-resonators may have a different thickness from another split-resonator different from the one split-resonator of the plurality of split-resonators. At this time, the thickness of the piezoelectric layer 4 may be made different, or the thickness of the dielectric film 9 may be made different.

In other words, it is sufficient for the acoustic wave device 1 to include a first resonator and a second resonator having mutually different thicknesses. To rephrase, the plurality of resonators 5 include the first resonator and the second resonator having mutually different thicknesses.

(6.9) Modification 9

In the acoustic wave device 1 according to the above-discussed preferred embodiment, the piezoelectric layer 4 is bonded to the support substrate 2 with the silicon oxide film 7 interposed therebetween, but the silicon oxide film 7 is not a necessary element. In addition to the silicon oxide film 7, another layer may be laminated between the support substrate 2 and the piezoelectric layer 4. In the acoustic wave device 1 according to the above-described preferred embodiment, the cavity 26 extends through the support substrate 2 in the thickness direction thereof. However, without being limited thereto, the cavity 26 may be provided, without passing through the support substrate 2, with an internal space of a recess that is provided in the first principal surface 21 of the support substrate 2.

(6.10) Other Modifications

In the preferred embodiment described above, at least a portion of the first electrode 51 may be buried in the piezoelectric layer 4. Alternatively, at least a portion of the second electrode 52 may be buried in the piezoelectric layer 4.

The electrode portion 50 may be provided on the second principal surface 42 of the piezoelectric layer 4. In this case, the first electrode 51 and the second electrode 52 face each other on the same principal surface (the second principal surface 42) of the piezoelectric layer 4.

In the above-described preferred embodiment, the cross-sectional shape of the first electrode 51 and the cross-sectional shape of the second electrode 52 are the same or substantially the same, but the cross-sectional shape of the first electrode 51 and the cross-sectional shape of the second electrode 52 may be different from each other. Here, the cross-sectional shape is, for example, orthogonal or substantially orthogonal to the thickness direction D1 and the second direction D2 of the piezoelectric layer 4.

In the preferred embodiment described above, the shapes of the first electrode 51 and the second electrode 52 may be different for each resonator 5. The shapes of the first electrode 51 and the second electrode 52 may be different between the series-arm resonator RS1 and the parallel-arm resonator RS2.

In the above-described preferred embodiment, the first electrode 51 and the second electrode 52 have a linear shape in a plan view from the thickness direction D1 of the piezoelectric layer 4, but are not limited thereto. The first electrode 51 and the second electrode 52 may have, for example, a curved shape, or a shape including a linear portion and a curved portion.

An acoustic wave device (1; 1*a*; 1*b*; 1*c*; 1*d*) according to a preferred embodiment of the present invention includes the piezoelectric layer (4), and the first electrode (51) and the second electrode (52) facing each other in a direction crossing the thickness direction (D1) of the piezoelectric layer (4). The acoustic wave device (1; 1*a*; 1*b*; 1*c*; 1*d*) utilizes a bulk wave of the thickness slip first-order mode. The acoustic wave device (1; 1*a*; 1*b*; 1*c*; 1*d*) includes the first resonator (for example, the series-arm resonator RS1) and the second resonator (for example, the parallel-arm resonator RS2). Each of the first resonator and the second resonator includes the first electrode (51), the second electrode (52), and the setting portion (400) where the first electrode (51) and the second electrode (52) are provided in the piezoelectric layer (4). The thickness of the first resonator excludes the thickness of the first electrode (51) and the second electrode (52) included in the first resonator in the setting portion (400) of the first resonator. The thickness of the second resonator excludes the thickness of the first electrode (51) and the second electrode (52) included in the second resonator in the setting portion (400) of the second resonator. The thickness of the first resonator is different from the thickness of the second resonator.

According to the above configuration, it is possible to increase a Q value and adjust a resonant frequency even when miniaturization is achieved.

An acoustic wave device (1; 1a; 1b; 1c; 1d) according to a preferred embodiment of the present invention includes the piezoelectric layer (4), and the first electrode (51) and the second electrode (52) facing each other in a direction crossing the thickness direction (D1) of the piezoelectric layer (4). The first electrode (51) and the second electrode (52) are electrodes adjacent to each other. The acoustic wave device (1; 1a; 1b; 1c; 1d) is configured such that, in any cross section along the thickness direction (D1), in a case that a distance between a center line of the first electrode (51) and a center line of the second electrode (52) is denoted as p, and a thickness of the piezoelectric layer (4) is denoted as d, d/p is not greater than about 0.5. The acoustic wave device (1; 1a; 1b; 1c; 1d) includes the first resonator and the second resonator. Each of the first resonator and the second resonator includes the first electrode (51), the second electrode (52), and the setting portion (400) including the setup region where the first electrode (51) and the second electrode (52) are provided in the piezoelectric layer (4). The thickness of the first resonator excludes the thickness of the first electrode (51) and the second electrode (52) included in the first resonator in the setting portion (400) of the first resonator. The thickness of the second resonator excludes the thickness of the first electrode (51) and the second electrode (52) included in the second resonator in the setting portion (400) of the second resonator. The thickness of the first resonator is different from the thickness of the second resonator.

According to the above configuration, it is possible to increase a Q value and adjust a resonant frequency even when miniaturization is achieved.

In an acoustic wave device (1; 1b; 1c; 1d) according to a preferred embodiment of the present invention, the thickness of the first resonator is a thickness of the piezoelectric layer (4) at the setting portion (400) included in the first resonator. The thickness of the second resonator is a thickness of the piezoelectric layer (4) at the setting portion (400) included in the second resonator.

According to the above configuration, the acoustic wave device (1; 1b; 1c; 1d) may improve resonance characteristics and adjust frequencies of the individual resonators (5) with ease by changing the thickness of the piezoelectric layer (4).

In an acoustic wave device (1a) according to a preferred embodiment of the present invention, at least one of the first resonator and the second resonator further includes the dielectric film (9). The thickness of the resonator including the dielectric film (9) among the first resonator and the second resonator is the sum of the thickness of the piezoelectric layer (4) included in the setting portion (400) in the resonator (5) and the thickness of the dielectric film (9) touching at the setting portion (400). Of the first resonator and the second resonator, the resonator not including the dielectric film (9) has a thickness equal or substantially equal to the thickness of the piezoelectric layer (4) at the setting portion (400) included in the above resonator.

According to the above configuration, the acoustic wave device (1a) may improve resonance characteristics and adjust frequencies of the individual resonators (5) with ease by changing at least one of the thickness of the piezoelectric layer (4) and the thickness of the dielectric layer (9).

In an acoustic wave device (1; 1a; 1b; 1c; 1d) according to a preferred embodiment of the present invention, each of the first resonator and the second resonator includes the dielectric film (9).

In an acoustic wave device (1; 1a; 1b; 1c; 1d) according to a preferred embodiment of the present invention, a difference between the thickness of the first resonator and the thickness of the second resonators is less than 100% of the thickness of the first resonator.

With this configuration, the acoustic wave device (1; 1a; 1b; 1c; 1d) may improve resonance characteristics.

In an acoustic wave device (1; 1a; 1b; 1c; 1d) according to a preferred embodiment of the present invention, d/p is not greater than about 0.24.

This configuration makes it possible to further increase the fractional bandwidth.

In an acoustic wave device (1; 1a; 1b; 1c; 1d) according to a preferred embodiment of the present invention, the first electrode (51) and the second electrode (52) are adjacent to each other. The first electrode (51) includes the first electrode principal portion (510), and the second electrode (52) includes the second electrode principal portion (520). The first electrode principal portion (510) intersects with the second electrode (52) in a direction in which the first electrode (51) and the second electrode (52) face each other. The second electrode principal portion (520) intersects with the first electrode (51) in the direction in which the first electrode (51) and the second electrode (52) face each other. The piezoelectric layer (4) includes the defined region (45) intersecting with both the first electrode (51) and the second electrode (52) in the direction in which the first electrode (51) and the second electrode (52) face each other in the piezoelectric layer 4, and located between the first electrode (51) and the second electrode (52), in a plan view from the thickness direction (D1) of the piezoelectric layer (4). The acoustic wave device (1; 1a; 1b; 1c; 1d) satisfies the condition of MR≤1.75×(d/p)+0.075, where S1 is an area of the first electrode principal portion (510) in a plan view from the thickness direction (D1) of the piezoelectric layer (4), S2 is an area of the second electrode principal portion (520) in the plan view from the thickness direction (D1) of the piezoelectric layer (4), S0 is an area of the defined region (45) in the plan view from the thickness direction (D1) of the piezoelectric layer (4), and MR is a structural parameter defined by an expression of (S1+S2)/(S1+S2+S0).

This configuration makes it possible to reduce or prevent spurious signals in the band.

In an acoustic wave device (1; 1a; 1b; 1c; 1d) according to a preferred embodiment of the present invention, the acoustic wave device further includes the first wiring portion (61) connected to the first electrode (51) and the second wiring portion (62) connected to the second electrode (52).

In an acoustic wave device (1; 1a; 1b; 1c; 1d) according to a preferred embodiment of the present invention, the first electrode (51) and the second electrode (52) face each other on a same or substantially a same principal surface of the piezoelectric layer (4).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a support substrate;
a piezoelectric layer provided above the support substrate; and
a first electrode and a second electrode facing each other in a direction crossing a thickness direction of the piezoelectric layer; wherein
the acoustic wave device utilizes a bulk wave of a thickness slip first-order mode, and includes a first resonator and a second resonator;
each of the first resonator and the second resonator includes the first electrode, the second electrode, and a setting portion at which the first electrode and the second electrode are provided in the piezoelectric layer;
an acoustic reflection layer is provided on the support substrate or the support substrate includes a first cavity that is directly below the first resonator and a second cavity that is directly below the second resonator;
a thickness of the first resonator excludes a thickness of the first electrode and the second electrode included in the first resonator in the setting portion of the first resonator;
a thickness of the second resonator excludes the thickness of the first electrode and the second electrode included in the second resonator in the setting portion of the second resonator; and
the thickness of the first resonator is different from the thickness of the second resonator.

2. An acoustic wave device comprising:
a support substrate;
a piezoelectric layer provided above the support substrate; and
a first electrode and a second electrode facing each other in a direction crossing a thickness direction of the piezoelectric layer; wherein
the first electrode and the second electrode are adjacent to each other;
when a distance between a center line of the first electrode and a center line of the second electrode is denoted as p, and a thickness of the piezoelectric layer is denoted as d, d/p is not greater than about 0.5 in any cross section along the thickness direction;
the acoustic wave device includes a first resonator and a second resonator;
each of the first resonator and the second resonator includes the first electrode, the second electrode, and a setting portion where the first electrode and the second electrode are provided in the piezoelectric layer;
an acoustic reflection layer is provided on the support substrate or the support substrate includes a first cavity that is directly below the first resonator and a second cavity that is directly below the second resonator;
a thickness of the first resonator excludes a thickness of the first electrode and the second electrode included in the first resonator in the setting portion of the first resonator;
a thickness of the second resonator excludes the thickness of the first electrode and the second electrode included in the second resonator in the setting portion of the second resonator; and
the thickness of the first resonator is different from the thickness of the second resonator.

3. The acoustic wave device according to claim 1, wherein
the thickness of the first resonator is a thickness of the piezoelectric layer at the setting portion included in the first resonator; and
the thickness of the second resonator is a thickness of the piezoelectric layer at the setting portion included in the second resonator.

4. The acoustic wave device according to claim 1, wherein
one of the first resonator and the second resonator further includes a dielectric film;
a thickness of the one of the first and second resonators including the dielectric film is a sum of the thickness of the piezoelectric layer at the setting portion included in the one of the first and second resonators and the thickness of the dielectric film at the setting portion; and
of the first resonator and the second resonator, the resonator not including the dielectric film has a thickness equal or substantially equal to the thickness of the piezoelectric layer at the setting portion included in the one of the first and second resonators.

5. The acoustic wave device according to claim 1, wherein
each of the first resonator and the second resonator includes the dielectric film; and
a thickness of each of the first and second resonators including the dielectric film is a sum of the thickness of the piezoelectric layer at the setting portion included in each of the first and second resonators and the thickness of the dielectric film at the setting portion.

6. The acoustic wave device according to claim 1, wherein a difference between the thickness of the first resonator and the thickness of the second resonator is less than 100%.

7. The acoustic wave device according to claim 2, wherein d/p is not greater than about 0.24.

8. The acoustic wave device according to claim 7, wherein
the first electrode and the second electrode are adjacent to each other;
the first electrode includes a first electrode principal portion intersecting with the second electrode in a direction in which the first electrode and the second electrode face each other;
the second electrode includes a second electrode principal portion intersecting with the first electrode in the direction in which the first electrode and the second electrode face each other;
the piezoelectric layer includes a defined region intersecting with both the first electrode and the second electrode in the direction in which the first electrode and the second electrode face each other in the piezoelectric layer, and located between the first electrode and the second electrode, in a plan view from the thickness direction of the piezoelectric layer; and
in the plan view from the thickness direction of the piezoelectric layer, when an area of the first electrode principal portion is denoted as S1, an area of the second electrode principal portion is denoted as S2, an area of the defined region is denoted as S0, and a structural parameter defined by an expression of $(S1+S2)/(S1+S2+S0)$ is denoted as MR, the acoustic wave device satisfies a condition of $MR \leq 1.75 \times (d/p) + 0.075$.

9. The acoustic wave device according to claim 1, further comprising:
a first wiring portion connected to the first electrode; and
a second wiring portion connected to the second electrode.

10. The acoustic wave device according to claim 1, wherein the first electrode and the second electrode face each other on a same or substantially a same principal surface of the piezoelectric layer.

11. The acoustic wave device according to claim 2, wherein
the thickness of the first resonator is a thickness of the piezoelectric layer at the setting portion included in the first resonator; and
the thickness of the second resonator is a thickness of the piezoelectric layer at the setting portion included in the second resonator.

12. The acoustic wave device according to claim 2, wherein
one of the first resonator and the second resonator further includes a dielectric film;
a thickness of the one of the first and second resonators including the dielectric film is a sum of the thickness of the piezoelectric layer at the setting portion included in the one of the first and second resonators and the thickness of the dielectric film at the setting portion; and
of the first resonator and the second resonator, the resonator not including the dielectric film has a thickness equal or substantially equal to the thickness of the piezoelectric layer at the setting portion included in the one of the first and second resonator.

13. The acoustic wave device according to claim 2, wherein
each of the first resonator and the second resonator includes the dielectric film; and
a thickness of each of the first and second resonators including the dielectric film is a sum of the thickness of the piezoelectric layer at the setting portion included in each of the first and second resonators and the thickness of the dielectric film at the setting portion.

14. The acoustic wave device according to claim 2, wherein a difference between the thickness of the first resonator and the thickness of the second resonator is less than 100% of the thickness of the first resonator.

15. The acoustic wave device according to claim 2, further comprising:
a first wiring portion connected to the first electrode; and
a second wiring portion connected to the second electrode.

16. The acoustic wave device according to claim 2, wherein the first electrode and the second electrode face each other on a same or substantially a same principal surface of the piezoelectric layer.

17. The acoustic wave device according to claim 1, wherein a material of the piezoelectric layer is lithium niobate or lithium tantalate.

18. The acoustic wave device according to claim 2, wherein a material of the piezoelectric layer is lithium niobate or lithium tantalate.

19. The acoustic wave device according to claim 2, wherein a thickness of the piezoelectric layer is in a range of about 50 nm to about 1000 nm.

20. The acoustic wave device according to claim 2, wherein a thickness of the piezoelectric layer is in a range of about 50 nm to about 1000 nm.

21. The acoustic wave device according to claim 1, wherein
the acoustic reflection layer is provided on the support substrate;
the acoustic reflection layer is in contact with the support substrate;
the acoustic reflection layer is in contact with the piezoelectric layer;
the acoustic reflection layer includes at least one high acoustic impedance layer and at least one low acoustic impedance layer, the at least one low acoustic impedance layer having a lower acoustic impedance than the at least one high acoustic impedance layer.

22. The acoustic wave device according to claim 21, wherein a thickness of the piezoelectric layer is in a range of about 50 nm to about 1000 nm.

23. The acoustic wave device according to claim 21, wherein a distance between a center line of the first electrode and a center line of the second electrode is in a range of about 1 μm to about 10 μm.

24. The acoustic wave device according to claim 21, wherein a width of the first electrode or a width of the second electrode is in a range of about 50 nm to about 1000 nm.

25. The acoustic wave device according to claim 21, wherein
the support substrate is a silicon substrate;
a plane orientation of a principal surface of the silicon substrate includes a (100) plane, (110) plane, or (111) plane; and
a resistivity of the silicon substrate is not less than about 1 kΩcm.

26. The acoustic wave device according to claim 1, wherein the support substrate includes the first cavity that is directly below the first resonator and the second cavity that is directly below the second resonator.

* * * * *